(12) United States Patent
Maejima

(10) Patent No.: US 7,944,282 B2
(45) Date of Patent: *May 17, 2011

(54) VOLTAGE GENERATION CIRCUIT AND SEMICONDUCTOR MEMORY USING THE SAME

(75) Inventor: Hiroshi Maejima, Suginami-ku (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/505,118

(22) Filed: Jul. 17, 2009

(65) Prior Publication Data

US 2010/0013549 A1    Jan. 21, 2010

Related U.S. Application Data

(63) Continuation of application No. 11/685,382, filed on Mar. 13, 2007, now Pat. No. 7,595,684.

(30) Foreign Application Priority Data

Mar. 13, 2006  (JP) ................................ 2006-067453
Dec. 6, 2006   (JP) ................................ 2006-329123

(51) Int. Cl.
    *G05F 1/10*    (2006.01)
(52) U.S. Cl. ........................................ 327/538; 327/536
(58) Field of Classification Search .................. 327/306, 327/308, 535, 536, 538, 540
    See application file for complete search history.

(56) References Cited

U.S. PATENT DOCUMENTS

| | | | |
|---|---|---|---|
| 6,002,354 A | 12/1999 | Itoh et al. | |
| 6,061,289 A | 5/2000 | Itoh et al. | |
| 6,107,862 A | 8/2000 | Mukainakano et al. | |
| 6,259,612 B1 | 7/2001 | Itoh | |
| 6,404,274 B1 | 6/2002 | Hosono et al. | |
| 6,456,153 B2 | 9/2002 | Buck et al. | |
| 6,552,519 B1 | 4/2003 | Nazarian | |
| 6,744,305 B2 | 6/2004 | Oikawa et al. | |
| 6,906,576 B2 | 6/2005 | Sivero et al. | |
| 6,914,473 B2 | 7/2005 | Hohenwarter | |
| 7,012,461 B1 | 3/2006 | Chen et al. | |
| 7,049,880 B2 | 5/2006 | Sivero et al. | |
| 7,453,741 B2 | 11/2008 | Kim et al. | |
| 7,489,566 B2 | 2/2009 | Kang | |
| 7,595,684 B2 * | 9/2009 | Maejima ....................... 327/538 |

FOREIGN PATENT DOCUMENTS

| | | |
|---|---|---|
| JP | 11-353889 | 12/1999 |
| JP | 2003-76431 | 3/2003 |

* cited by examiner

*Primary Examiner* — Lincoln Donovan
*Assistant Examiner* — Patrick O'Neill
(74) *Attorney, Agent, or Firm* — Oblon, Spivak, McClelland, Maier & Neustadt, L.L.P.

(57) ABSTRACT

The voltage generation circuit having a standard voltage generation circuit, a reference voltage, a minimum voltage setting circuit, and a voltage setting circuit that gradually sets voltage by switching a plurality of the gate transistors to switch a combination of resistive elements. The voltage generation circuit includes a differential amplifier that has one input terminal connected to the reference voltage generated by the standard voltage generation circuit and another input terminal connected to the minimum voltage setting circuit. The differential amplifier has an output node showing the result of a difference voltage of the inputs. The voltage generation circuit includes a pump control circuit that outputs a control signal controlling a charge-pump motion, based on the differential voltage, and a charge pump circuit that sets up and outputs the voltage by the control signal.

11 Claims, 21 Drawing Sheets

FIG.6

| Decimal | Binary | | | Thermometer | | | | | | | |
|---|---|---|---|---|---|---|---|---|---|---|---|
| | A0 | A1 | A2 | T1 | T2 | T3 | T4 | T5 | T6 | T7 |
| 0 | 0 | 0 | 0 | 0 | 0 | 0 | 0 | 0 | 0 | 0 |
| 1 | 0 | 0 | 1 | 0 | 0 | 0 | 0 | 0 | 0 | 1 |
| 2 | 0 | 1 | 0 | 0 | 0 | 0 | 0 | 0 | 1 | 1 |
| 3 | 0 | 1 | 1 | 0 | 0 | 0 | 0 | 1 | 1 | 1 |
| 4 | 1 | 0 | 0 | 0 | 0 | 0 | 1 | 1 | 1 | 1 |
| 5 | 1 | 0 | 1 | 0 | 0 | 1 | 1 | 1 | 1 | 1 |
| 6 | 1 | 1 | 0 | 0 | 1 | 1 | 1 | 1 | 1 | 1 |
| 7 | 1 | 1 | 1 | 1 | 1 | 1 | 1 | 1 | 1 | 1 |

(A0,A1,A2) ⇒ Binary to Thermometer conversion ⇒ (T1,T2,T3,T4,T5,T6,T7)

VOLTAGE GENERATION CIRCUIT AND SEMICONDUCTOR MEMORY USING THE SAME

CROSS-REFERENCE TO RELATED APPLICATIONS

This application is a Continuation of application Ser. No. 11/685,382, filed Mar. 13, 2007 which is based upon and claims the benefit of priority from the prior Japanese Patent Applications No. 2006-067453, filed on Mar. 13, 2006, and Japanese Patent Applications No. 2006-329123, filed on Dec. 6, 2006, the entire contents of which are incorporated herein by reference.

TECHNICAL FIELD

The present invention relates to a voltage generation circuit which gradually sets voltage and a semiconductor memory using the same.

BACKGROUND OF THE INVENTION

1. Field of the Invention

Conventionally, a high voltage which is required for program or erasure is generated inside a chip by an internal voltage generation circuit accompanied with the use of a single power supply in a non-volatile semiconductor memory.

2. Description of the Related Art

A voltage limiter circuit (voltage setting circuit) is used in the internal voltage generation circuit, since a power supply voltage supplied from the outside is stepped up by the charge pump circuit and an output voltage of the charge pump circuit is set at a desired voltage value (internal voltage) (see Japanese Patent Application Laid Open No. 11-353889).

The voltage limiter circuit using an R-2R resistance ladder which is a kind of current additional D/A converter has been employed, if it is necessary to set a number of variable voltages in a conventional non-volatile semiconductor memory. The voltage limiter circuit using the R-2R resistance ladder requires two differential amplifiers in a part of the circuit composition. However, the system had the problem that a desired voltage step could not be obtained if offset occurs between the two differential amplifiers themselves due to dispersion in processes or the like.

SUMMARY OF THE INVENTION

The voltage generation circuit of one embodiment in the present invention provided with:

a standard voltage generation circuit that generates a reference voltage, a minimum voltage setting circuit that sets a minimum voltage, a voltage setting circuit that has a plurality of resistive elements and a plurality of gate transistors connected to a plurality of the resistive elements and gradually sets voltage by switching a plurality of the gate transistors to switch a combination of a plurality of the resistive elements, a differential amplifier that has two input terminals and one output node, one input terminal is connected to the reference voltage that is generated by the standard voltage generation circuit, another input terminal is connected to the minimum voltage setting circuit and the voltage setting circuit that has a plurality of resistive elements and a plurality of gate transistors connected to a plurality of the resistive elements, and the output node shows the result of the difference voltage of these two inputs, a pump control circuit that outputs a control signal to control a charge-pump motion, based on the differential voltage, and a charge pump circuit that outputs voltage by stepping up the voltage with the control signal.

BRIEF DESCRIPTION OF THE DRAWINGS

FIG. 6 is a view showing a correspondence between a binary code and a thermometer code of the second embodiment in the present invention.

DETAILED DESCRIPTION OF THE INVENTION

The embodiments in the present invention are described below in detail with reference to the drawings. However, the present invention may be implemented in a number of different embodiments and should not be construed by merely limiting to the descriptions of the embodiments below-mentioned.

Figure 7:
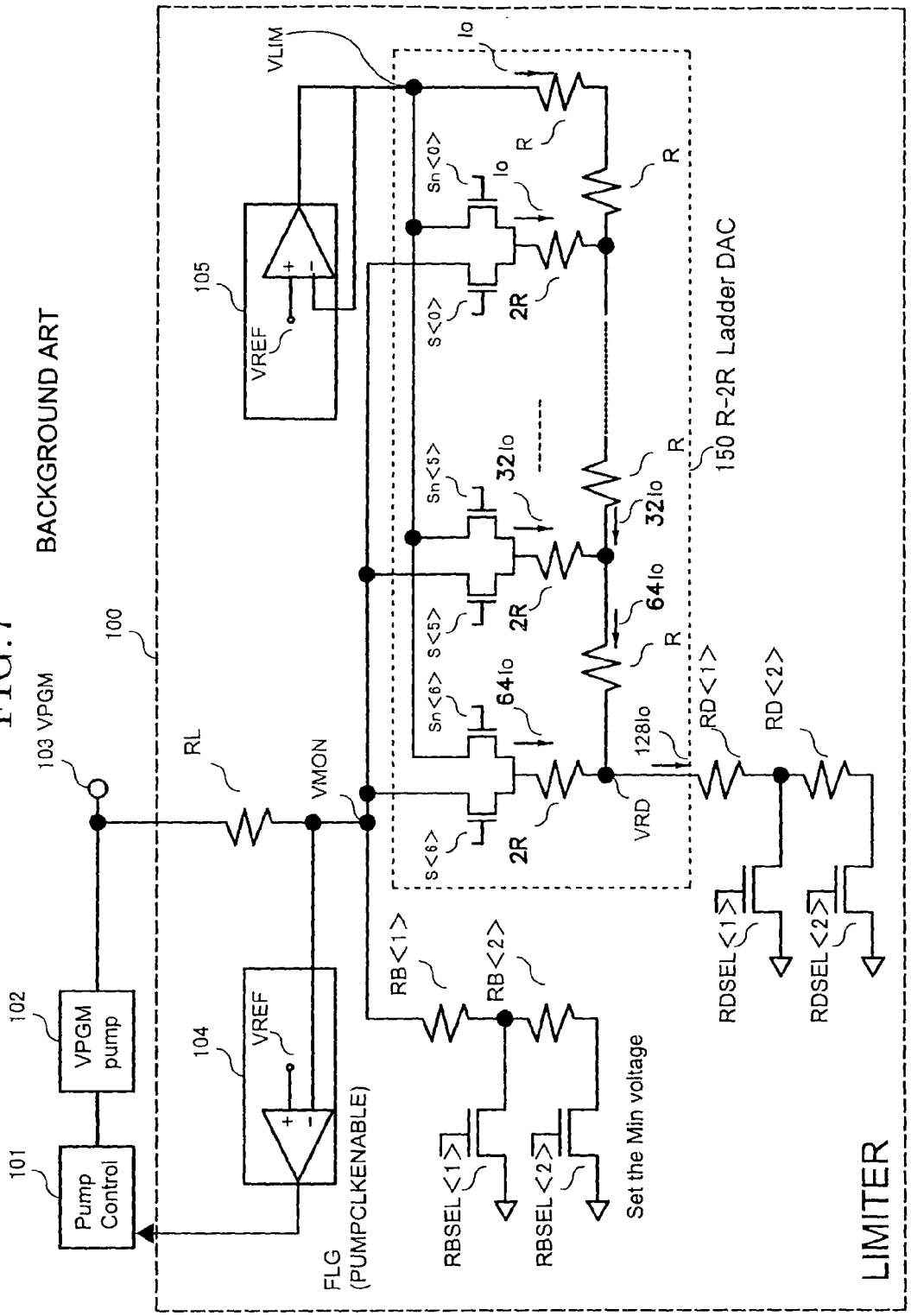
FIG. 7 is a view showing a conventional voltage generation circuit.

FIG. 7 is a view showing a program voltage (VPGM) generation circuit of a non-volatile semiconductor memory as one example. The voltages in readout voltage, program voltage, and erasure voltage are each different in the non-volatile semiconductor memory. In addition, it is indispensable for having a voltage generation circuit that accurately steps up voltage, because a plurality of gradual readout voltages and program voltages are required in a multi-valued non-volatile semiconductor memory where data of a plurality of bits are stored in a single memory cell, in accordance with the variation of a threshold voltage from the state of erasure.

The voltage generation circuit shown in FIG. 7 is composed of a charge pump circuit 102, a pump control circuit 101, and a limiter circuit 100. The limiter circuit 100 is provided with two differential amplifiers 104, 105, a plurality of switching transistors, and a plurality of resistive elements.

In the limiter circuit 100, the potential of a comparison voltage detection node VMON is compared in the differential amplifier 104 with a reference voltage VREF. The differential amplifier 104 compares the potential of the comparison voltage detection node VMON with the reference voltage VREF, and outputs a signal instructing a charge-pump motion or a charge-pump stop to the pump control circuit 101 in accordance with its comparison results. Concretely, if the potential of the comparison voltage detection node VMON is lower than the reference voltage VREF, the differential amplifier outputs a signal instructing a charge-pump motion to the pump control circuit 101 to cause the charge pump circuit 102 to take the motion of a charge-pump, it is operated to increase the VPGM voltage outputted from an output node 103. In addition, if the VPMG voltage of the output node 103 is increased and the potential of the comparison voltage detection node VMON is higher than the reference VREF, it outputs a signal instructing stop of charge-pump motion to the pump control circuit 101 to suspend the charge-pump motion of the charge pump circuit 102. Namely, a partial potential obtained in the comparison voltage detection node VMON is feedback-controlled by the differential amplifier 104 so as to be equipotential to the reference voltage VREF, and the output node 103 outputs a predetermined stable voltage of the VPGM voltage.

The resistive element RL is a feedback resistive element that is connected between the output node 103 and the comparison voltage detection node VMON and feedbacks a partial voltage output to a non-inverting input terminal of the differential amplifier 104. Here, if a resistance between the comparison voltage detection node VMON and the ground is assumed as RS (not illustrated), the VPGM voltage of the output node 103 is expressed by the following formula (1) if the feedback resistive element RL connected between the output node 103 and the comparison voltage detection node VMON and the resistance RS between the comparison voltage node VMON and the ground are used.

$$VPGM = VREF*(1+RL/RS) \qquad (1)$$

A R-2R ladder resistance network 150 shown in FIG. 7 is composed of 8 resistance elements R, gate transistors S<0> to S<6> that select either 7 resistance elements 2R or 7 resistance elements 2R, and non-inverting input gate transistors Sn<0> to Sn<6> where an inverting signal is each inputted into a gate terminal. In addition, a 2R shows that the resistance value is twice as much as the resistance value of R.

Each drain terminal of the gate transistors S<0> to S<6> is connected to the comparison voltage detection node VMON. On the contrary, each drain terminal of the inverting gate transistors Sn <0> to Sn <6> is connected to an output terminal of a VLIM input differential amplifier 105 used as a voltage follower.

7 bits can be selected by selectively controlling the gate transistors S<0> to S<6> and the inverting input gate transistors Sn<0> to Sn<6> that are to be operated, and the output voltage of the VPGM in the output node 103 can be switched to a 128-step.

The R-2R ladder resistance network 150 connected between the comparison voltage detection node VMON and the ground and the resistive elements RB<1>, RB<2> connected so as to be parallel with the resistive element RD determine the VPGM minimum voltage (VPGM_MIN) that can be outputted from the output node 103. The VPGM_MIN is expressed by the following formula (2).

$$VPGM\_MIN = VREF*(1+RL/RB) \qquad (2)$$

However, RD is RB<1> or RB<1>+RB<2> by selecting the gate transistors RBSEL<1> and RBSEL<2>.

In addition, the step width of the 128-step voltages (Vstep) is determined by the resistive elements RD<1> and RD<2> connected in series to the R-2R ladder resistance network 150. The Vstep is expressed by the following formula (3).

$$Vstep = VREF*(RL/(R+RD))/128 \qquad (3)$$

However, RD is RD<1> or RD<2> by selecting the gate transistors RDSEL<1> and RDSEL<2>.

The VPGM of the output node 103 that can select the 7 bits by selectively controlling the gate transistors S<0> to S<6> and the inverting input gate transistors Sn<0> to Sn<6> are expressed by the following formula (4).

$$VPGM = VPGM\_MIN + Vstep*(64*S<6>+32*S<5>+16*S<4>+8*S<3>+4*S<2>+2*S<1>+S<0>) \qquad (4)$$

In the formula (4), the value of "1" or "0" is inputted in the gate transistors S<0> to S<6>. The gate transistors S<0> to S<6> are 1 if they are turned ON and are 0 if they are turned OFF. On the contrary, for each of the inverting input gate transistors Sn<0> to Sn<6>, the value is an inverted one. The VPGM voltage of the output node 103 outputs the VPGM_MIN if the gate transistors S<0> to S<6> are all turned OFF and outputs the maximum voltage (VPGM_MAX) that can be set if they are all turned ON.

The potential of the comparison voltage detection node VMON inside the R-2R ladder resistance network 150 and that of the voltage follower output node VLIM are controlled by the VMON input differential amplifier 104 where the comparison voltage detection node VMON is inputted and the VLIM input differential amplifier 105 where the voltage follower output node VLIM is inputted so as to be equal to the reference voltage VREF.

Ideally, the sum of the potential of the node VRD and the current flowing in the resistors RD<1> and RD<2> is kept constant by each motion of these differential amplifiers 104, 105, but not by the set voltages. A voltage step-up can be set by switching the set voltages with the selection of the gate transistors S<0> to S<6>, the inverting input gate transistors Sn<0> to Sn<6>, the gate transistors RBSEL<1>, <2>, and the RDSEL <1>, <2>.

However, there may be a case where an offset voltage occurs between the inverting input terminals and the non-inverting input terminals of these VMON input differential amplifiers 104 and VLIM input differential amplifier 105 due to dispersion in processes or the like, the system is stably operated at voltage different from the VREF potential even if any one of the differential amplifiers is used. Then, the width of a voltage step-up is not constant if the offset voltage of the VMON input differential amplifier 104 and that of the VLIM input differential amplifier 105 are different. Namely, if the gate transistors S<0> to S<6> whose drain terminals connected to the inverting input terminals of the VMON input differential amplifier 104 are switched to the inverting input gate transistors Sn<0> to Sn<6> whose drain terminals connected to the inverting input terminals of the VLIM input differential amplifier 105, the potentials of the drain terminals in the gate transistors S<0> to S<6> are different from those of the drain terminals in the inverting input gate transistors Sn<0> to Sn<6> by a difference in offset voltages between the VMON input differential amplifier 104 and the VLIM input differential amplifier 105. This changes a quantity of current flowing in the resistances RD<1>, RD<2> because a quantity of current flowing in them from the VMON side and the VLIM side changes. The voltage of the node VRD also changes accordingly. Therefore, a certain width of voltage step-up can not be obtained.

In addition, an error in case there is dispersion in the resistance value of a resistive element should be also considered.

The first embodiment in the present invention mentioned below is to provide a high accuracy voltage generation circuit by keeping the width of a voltage step constant. The circuit is not necessary with a pair of differential amplifiers and uses a current additional D/A converter of a combination of a binary code or the binary code with a thermometer code. The problem of an offset voltage difference between the differential amplifiers is eliminated by dispensing with a pair of the differential amplifiers and the voltage generation circuit that increases voltage in a high accuracy and constant voltage step width can be provided. In addition, the binary code is used for lower bits of a voltage set data having a plurality of bits, the thermometer code is used for upper bits to allow an addition method of corresponding resistance values of resistive elements to correspond to a case that the binary code is controlled and a case that the thermometer code is controlled. This allows the affection of dispersion in resistance values of individual resistive elements to be minimized when the most significant bit is switched, for example, when it is switched from "01111111" to "10000000".

First Embodiment

Figure 1:
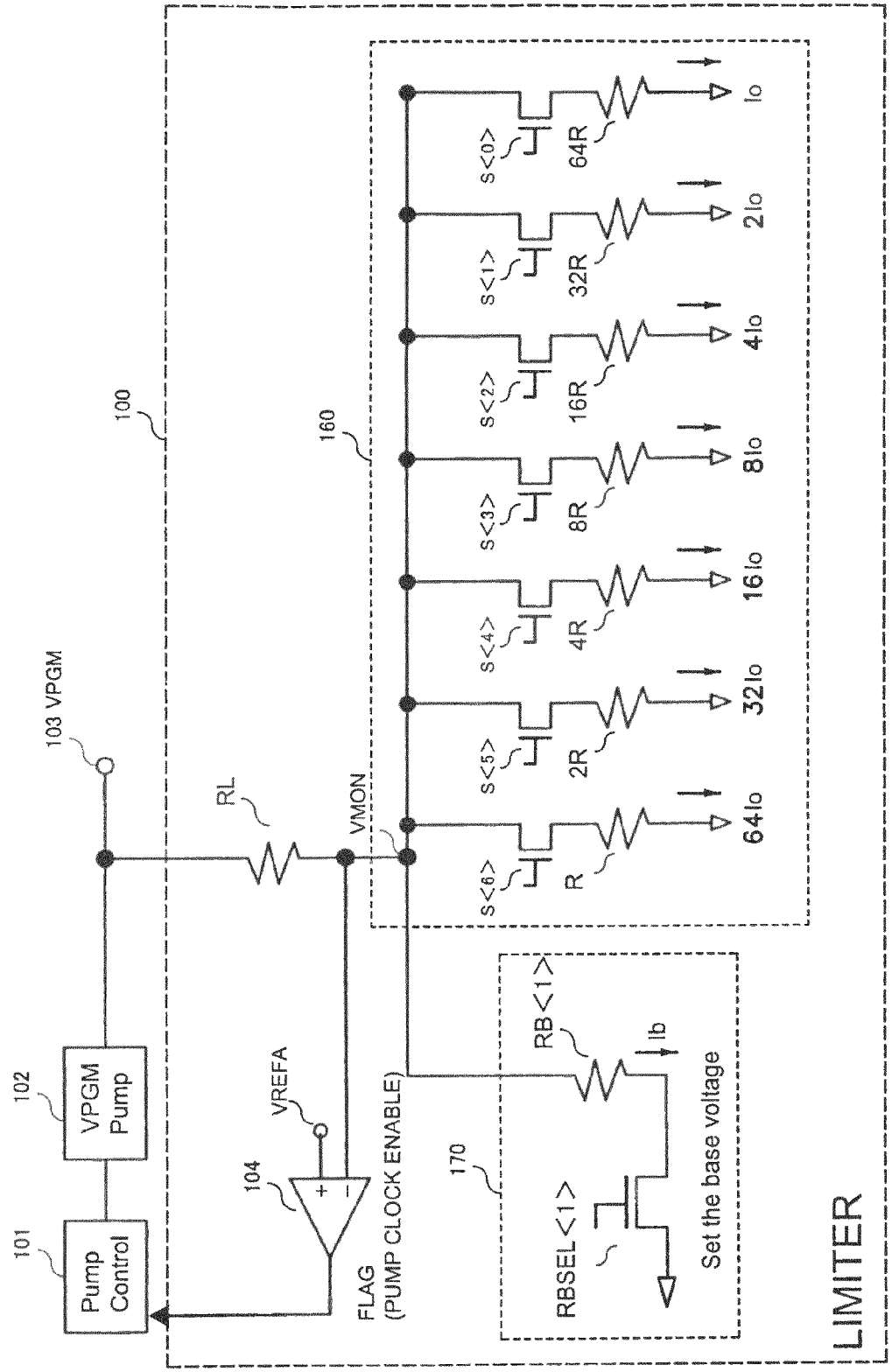
FIG. 1 is a circuit diagram of a voltage generation circuit of a first embodiment in the present invention.

A circuit diagram of a voltage generation circuit of the first embodiment in the present invention is shown in FIG. 1. The voltage generation of the first embodiment in the present invention has one differential amplifier 104, a reference voltage VREFA, a charge pump circuit 102, a pump control circuit 101, an output node 103, a comparison voltage detection node VMON, a feedback resistive element RL, a voltage setting circuit 160, and a minimum voltage setting circuit 170. The voltage setting circuit 160 uses a binary current additional voltage setting circuit (limiter circuit).

The resistance RB of the minimum voltage setting circuit 170 determines the VPGM minimum voltage VPGM_MIN that can be outputted from the output node 103. The VPGM_MIN is expressed by the following formula (5).

$$VPGB\_MIN = VREFA*(1+RL/RB) \qquad (5)$$

Next, the width of stepped-up voltage of the VPGM voltage outputted from the output node 103 is described. The voltage setting circuit 160 controls the current flowing from a power supply of the same voltage as the reference voltage VREF by selecting resistive elements and sets the VPGM voltage value of the output node 103 by controlling the voltage drop of the feedback resistive element RL. Therefore, the potential of the VREFA may be changed to change the width of step voltage of the VPGM voltage.

Figure 2:
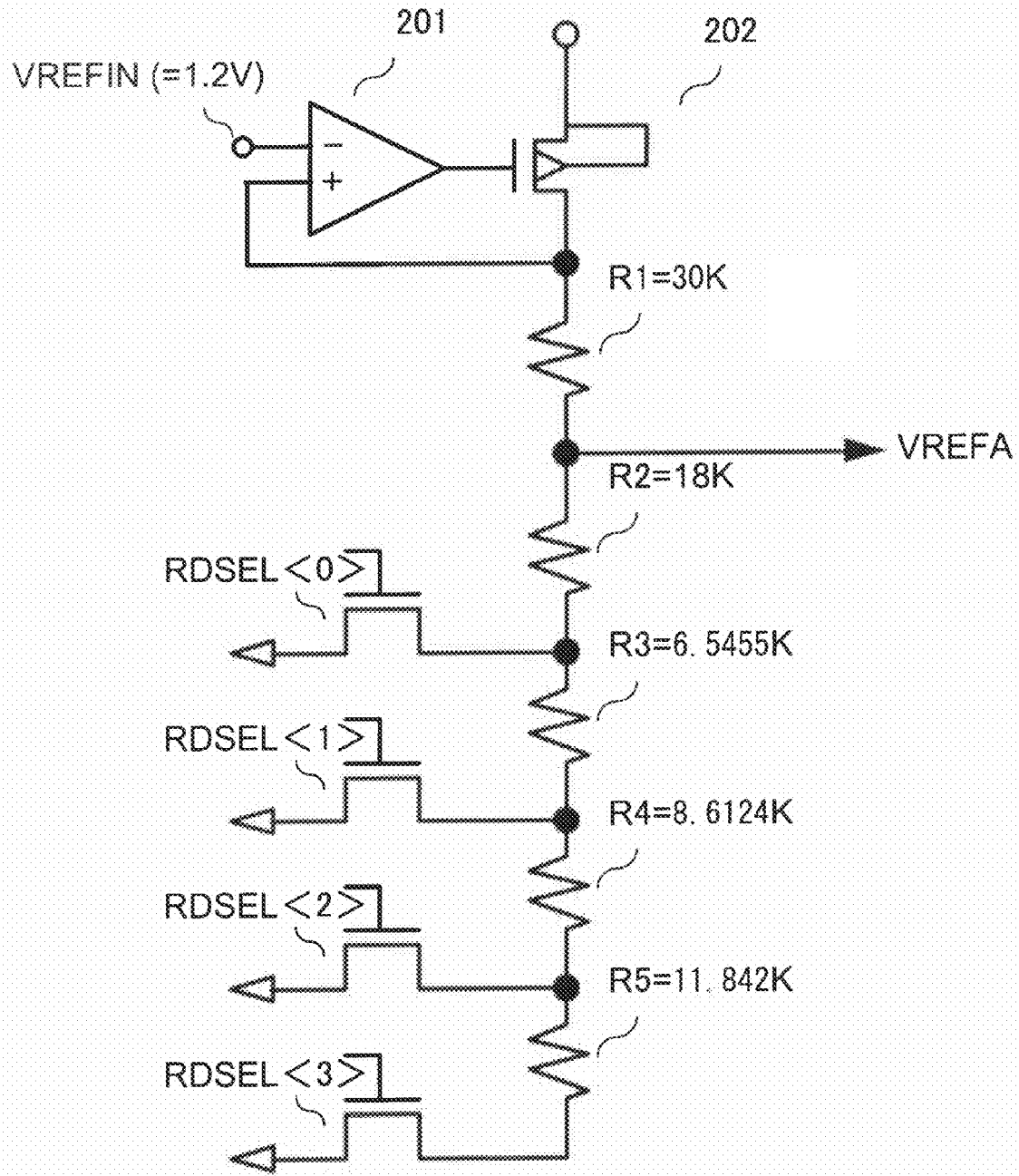
FIG. 2 is a schematic diagram of a standard voltage generation circuit of the first embodiment in the present invention.

FIG. 2 is a view showing a schematic configuration of the standard voltage generation circuit that generates the reference voltage VREFA inputted in the non-inverting input terminal of the differential amplifier 104. The standard voltage generation circuit shown in FIG. 2 is composed of the differential amplifier 201 used as a voltage follower, a VREFIN that becomes its reference voltage, a P channel MOS transistor 202 connected to the output of the differential amplifier 201, resistive elements R1 to R5, and an output node 203 that outputs the reference voltage VREFA.

The standard voltage generation circuit sets the potential of the reference voltage VREFA outputted from the output node 203 by dividing the reference voltage VREFIN. The standard voltage generation circuit can set various widths of step voltages (0.15V, 0.2V or the like) by selecting the resistive elements R1 to R5 to change resistance values. The width of step voltage Vstep of the VPGM is expressed by the following formula (6).

$$Vstep = VREFA*RL/64R \qquad (6)$$

If the VREFA that is to be the reference voltage is assumed as 1.2V, the resistive elements are each assumed as $R1=30K\Omega$, $R2=18K\Omega$, $R3=6.5455K\Omega$, $R4=8.6124K\Omega$, and $R5=11.842K\Omega$ from the top, and the gate transistors that are to be selectively controlled are assumed as RDSEL<0> to <3>, the reference voltage VREFA outputted from the output node 203 can be set by the following combinations.

When the RDSEL<0> is turned ON, VREFA=0.45V, and Vstep=0.125V. When RDSEL<1> is turned ON, VREFA=0.54V, and Vstep=0.150V. When RDSEL <2> is turned ON, VREFA=0.63V, and Vstep=0.175V. When RDSEL <3> is turned ON, VREFA=0.72V, and Vstep=0.200V.

The voltage setting circuit (binary current addition section) in FIG. 1 arranges the resistive elements so as to allow the current to gradually vary (step up) at equal distances in response to the binary data. In the voltage setting circuit (binary current addition section) 160 in FIG. 1, the current is increased in response to the counting-up of the binary data by arranging and connecting the resistive elements so as to be parallel and to allow each resistance value to be half as much as that of the previous resistive element sequentially from a resistance value that is to be a reference. Therefore, the VPGM voltage of the output node 103 can be stepped up by inputting the binary data in the gates of the gate transistors S<0> to S<6> to selectively control them.

In the first embodiment in the present invention shown in FIG. 1, the 7 bit of 128-step, that is, voltage switching can be performed, and the VPGM voltage of the output node 103 is expressed by the following formula (7).

$$VPGM = VPGM\_MIN + Vstep*(64*S<6>+32*S<5>+ \\ 16*S<4>+8*S<3>+4*S<2>+2S<1>+S<0>) \qquad (7)$$

In the formula (7), value of "1" or "0" is inputted in the gate transistors S<0> to S<6>. The gate transistors S<0> to S<6> are "1" if they are turned ON and "0" if they are turned OFF. The gate transistors S<0> to S<6> output the VPGM_MIN when they are all turned OFF and output the VPGM_MAX when they are all turned ON.

A selection of a resistive element for stepping up current in response of addition of a binary data is secured to some extent by taking a method that the same sized resistance unit in layout is sequentially arranged by ½ times.

The voltage setting circuit inevitably had two power supplies, because a pair of differential amplifiers was employed in a program voltage generation circuit used for a conventional semiconductor memory or the like. Then, the system had the problem that the width of voltage step-up was not constant, because the two power supply voltages of the voltage setting circuits that should be originally the same were different, if the offset voltages of these two differential amplifiers are different.

The first embodiment in the present invention can eliminate the problem of the offset between the differential amplifiers by removing a pair of the differential amplifiers and can provide the voltage generation circuit that steps up the voltage in a high-accuracy and constant width of voltage step.

Second Embodiment

However, the system may have a problem in accuracy in the stepped-up voltage of the VPGM voltage, because a desired current may not be adjusted, if resistive elements acting as a current adjustment disperses when the number of bits for voltage switching increases in a simple binary current additional voltage setting circuit shown in the first embodiment in the present invention.

Figure 3:
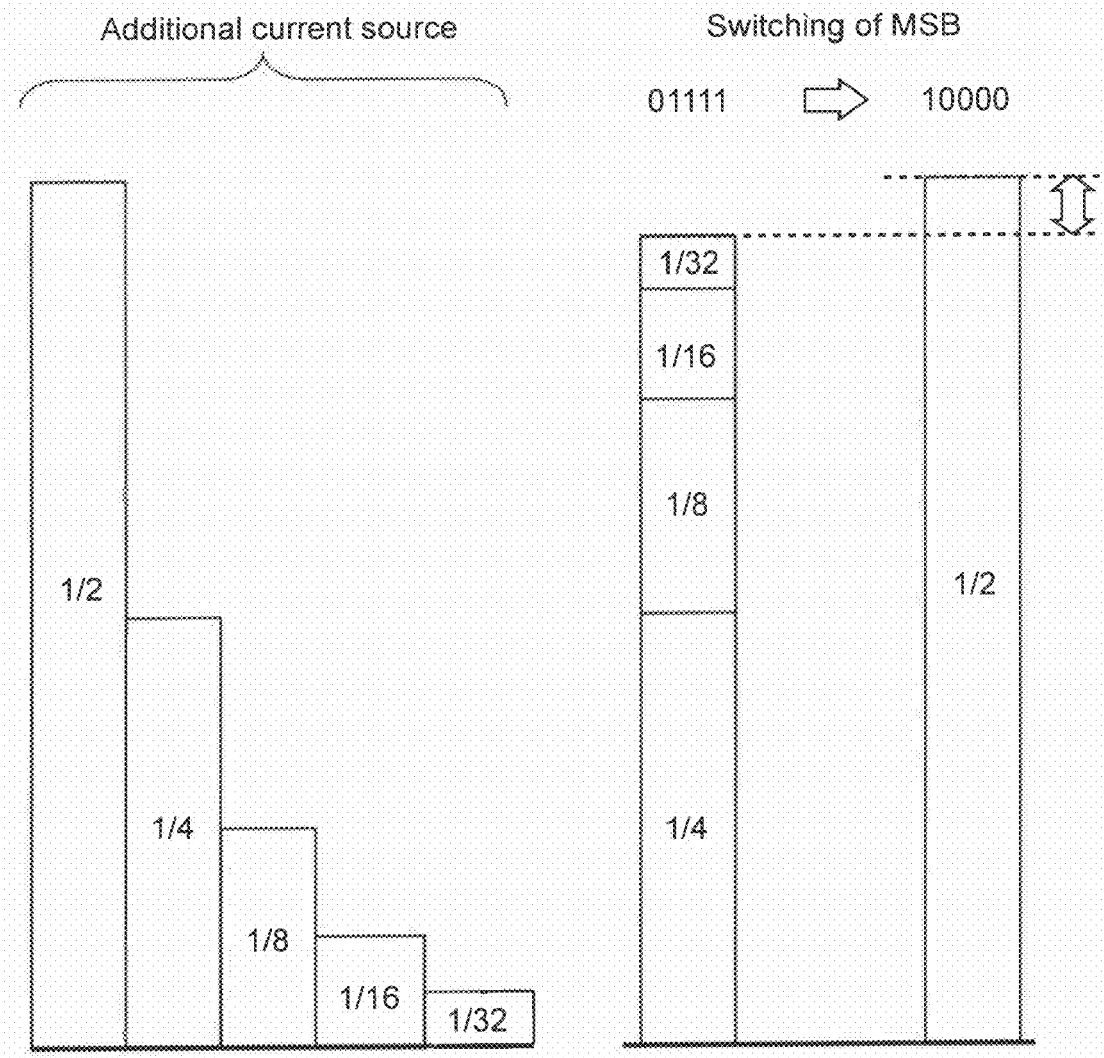
FIG. 3 is a view showing current variations at the time of switching MSB in a binary data of the first embodiment in the present invention.
Figure 4:
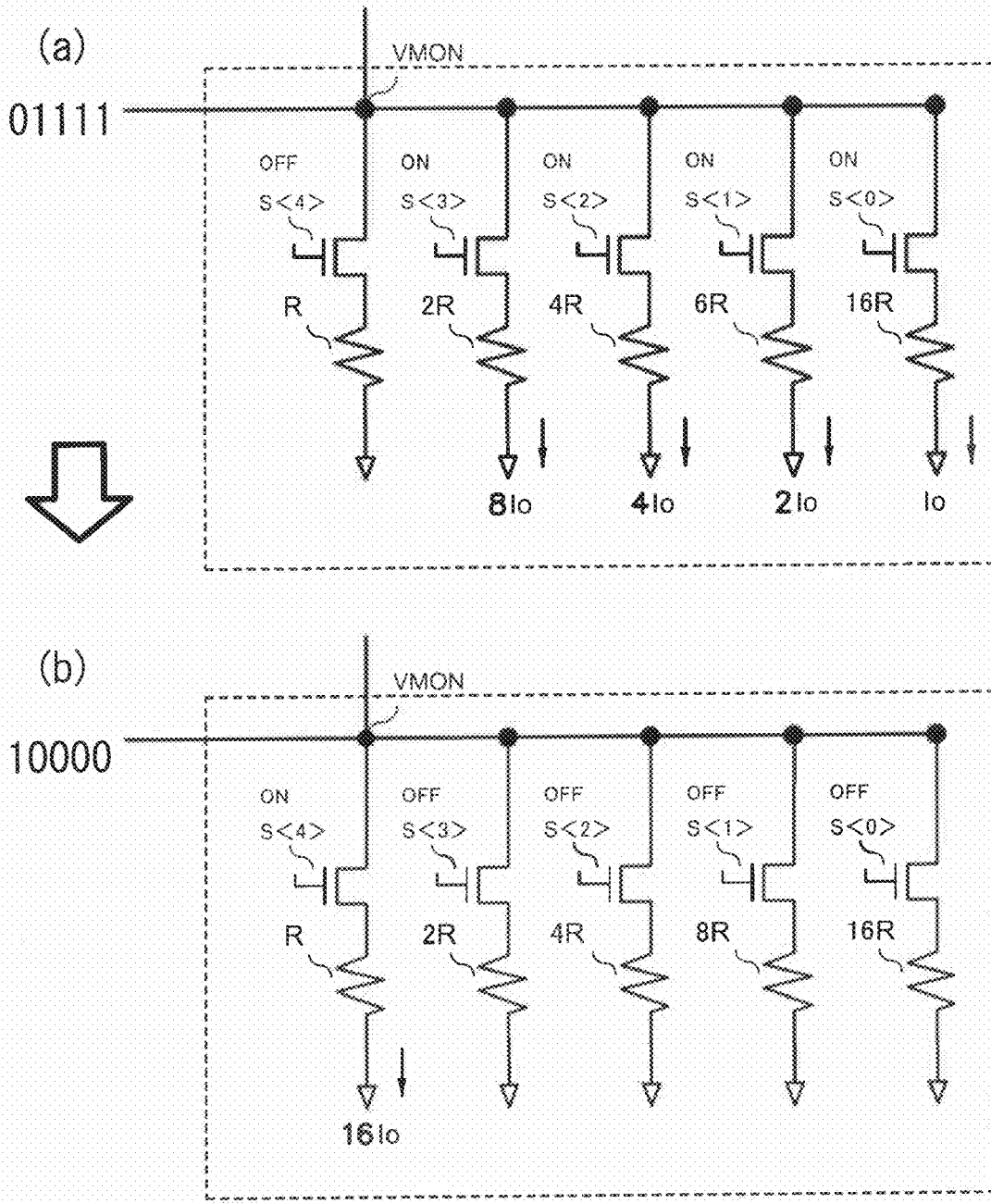
FIG. 4 is a view showing switching of resistance rows at the time of switching MSB in the binary data in the voltage generation circuit of the first embodiment in the present invention.

FIG. 3 is a view showing changes in current at a time when the MSB (Most Significant Bit) switching from "01111" to "10000" is switched relative to a 5-bit voltage set data. $15/32$ is changed to $16/32$ (½) in current if the bit of the voltage set data is switched from "01111" to "1000" as shown in FIG. 3. An increment in current is $1/32$. However, the entirely different resistance rows are simultaneously switched, because the resistance rows that had been hitherto selected become all unselected ones and only one row of the resistance rows that had not been hitherto selected is newly selected. FIG. 4(a) and FIG. 4(b) are the views showing the voltage generation circuit including the voltage setting circuit corresponding to the 5-bit voltage set data. An increment is $1/32$ which is from $15/32$ to $16/32$ (½) as an increment in current at the time of switching the MSB. However, what the entirely different resistance rows are simultaneously switched is shown, because the resistance rows of S<0> to S<3> that have been hitherto selected become all unselected ones and the resistance row of S<4> that has not been hitherto selected is newly selected, as shown in FIG. 4(a).

If any one of the resistance values of the resistive elements in the resistance row has an error, the system is mostly affected by the error of the resistance value at the time of switching the MSB. If so, a desired correct set voltage can not be obtained. This problem becomes significant in upper bits when the number of bits is increased by increasing the number of steps of set voltage in the voltage setting circuit.

Figure 5:
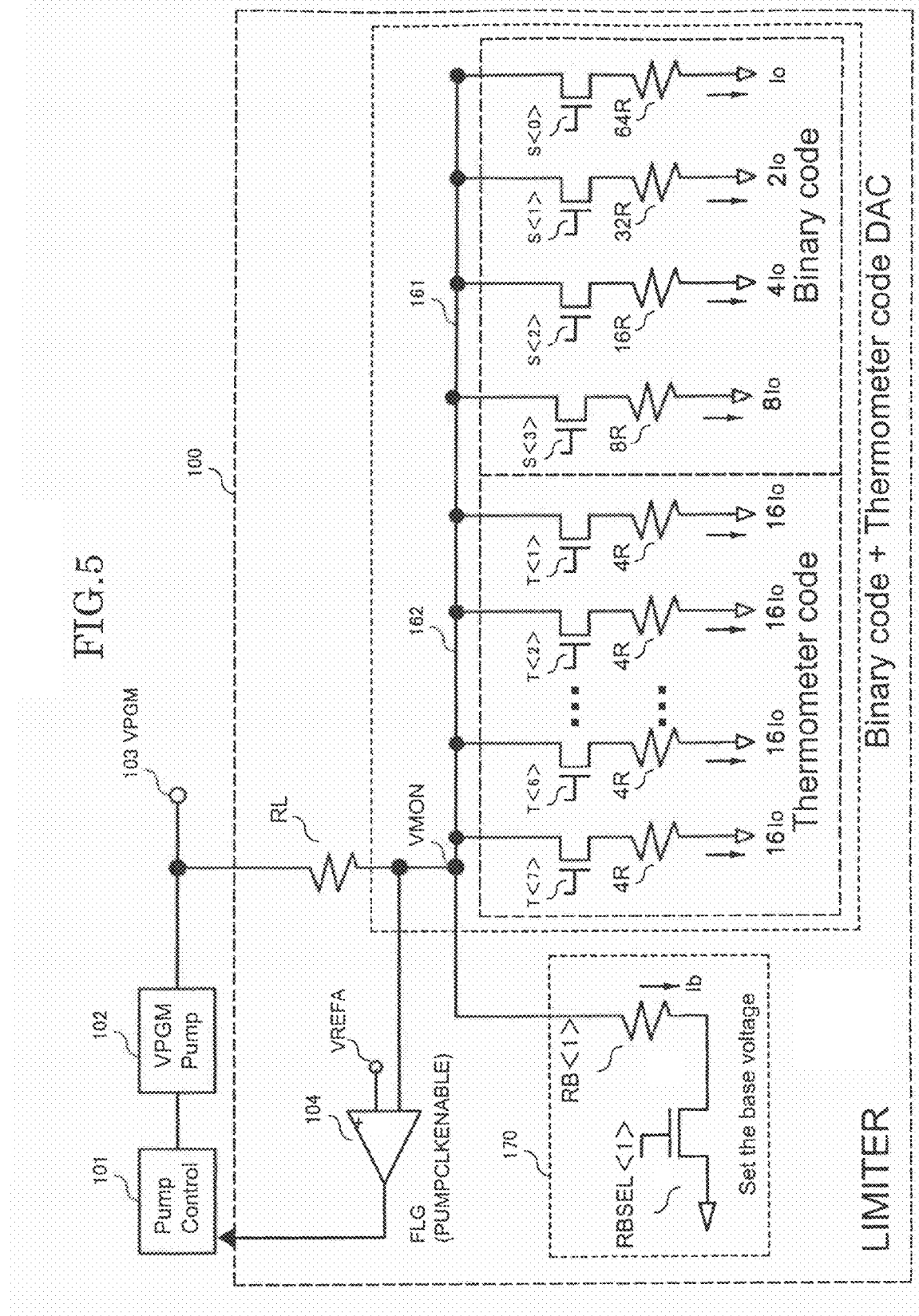
FIG. 5 is a circuit diagram of a voltage generation circuit of a second embodiment in the present invention.

A circuit diagram of the voltage setting circuit of the second embodiment in the present invention is shown in FIG. 5. The voltage generation circuit of the second embodiment in the present invention shown in FIG. 5 is a current additional limiter where a thermometer code is combined with a binary code. The inventor of the present invention has created the invention as an embodiment that improves the condition that a desired set voltage can not be correctly obtained by the affection of an error of the resistance value in the resistive element at the time of switching the MSB mentioned above.

FIG. 6 is a view showing a relation between a binary code and a thermometer code. The thermometer code is a data code where the number of bits of "1" expressed by the binary notation becomes a figure expressed as it stands. For example, when "0", "1", "2", "3", "4", "5", "6", and "7" in the decimal notation are expressed by in a binary data, they are expressed in 3 bits, namely, they are sequentially "000", "001", "010", "011", "100", "101", "111". When they are expressed in the thermometer code, they are expressed in 7 bits, namely, they are sequentially "0000000", "0000001", "0000011", "0000111", "0001111", "0011111", "0111111", and "1111111".

The voltage generation circuit of the second embodiment in the present invention shown in FIG. 5 is provided with one differential amplifier 104, a reference VREFA, a charge pump circuit 101, a pump control circuit 102, an output node 103, a comparison voltage detection node VMON, a feedback resistive element RL, and a minimum voltage setting circuit 170 as in the first embodiment in the present invention. The point different from the first embodiment in the invention is that the voltage setting circuit is composed of two kinds of a first voltage setting circuit 161 and a second voltage setting circuit 162.

The first voltage setting circuit 161 is selectively controlled by the binary code, the second voltage setting circuit 162 is selectively controlled by the thermometer code. The binary code is used for the lower bits that does not require quite a sever accuracy (hardly affected even if resistances disperse), the thermometer code is used for the upper bits that requires a strict accuracy (easily affected by dispersion in resistance) that beefs up resistance to dispersion in resistance.

Only a $1/64$-error is allowed for the resistance R selected by the gate transistor S<6> of the most significant bit at the upper bits in the voltage setting circuit of a 7-bit binary code composing the voltage generation circuit of the first embodiment in the present invention shown in FIG. 1. On the contrary, an error equivalent to a $1/16$ one is allowed for the resistive element 4R selected by the gate transistors T<1> to T<7>, because the upper three bits are used for the thermometer code in the voltage generation circuit composing the voltage generation circuit of the second embodiment in the present invention shown in FIG. 5.

The minimum voltage VPGM_MIN of the VPGM that can be outputted from the output node 103 is expressed by the following formula (8) as in the first embodiment in the present invention.

$$VPGM\_MIN = VREFA*(1+RL/RB) \quad (8)$$

The width of stepped-up voltage of the VPGM is determined by changing the potential of the VREFA as in the first embodiment in the present invention, and the width of voltage step-up of the VPGM is expressed by the following formula (9).

$$V\text{step} = VREFA*RL/64R \quad (9)$$

The VPGM voltage of the output node 103 of the second embodiment in the present invention shown in FIG. 5 is expressed by the following formula (10), different from the output voltage of the first embodiment in the present invention.

$$VPGM = VPGM\_MIN + V\text{step}*[16*(T<7>+T<6>+ \\ T<5>+T<4>+T<3>+T<2>+T<1>) \\ 8*S<3>+4*S<2>+2*S<1>+S<0>] \quad (10)$$

The S<0> to S<3> are the gate transistors in the binary code section. The T<0> to T<7> are the gate transistors in the thermometer code section. The gate transistors S<0< to S<3> and the gate transistors T<0> to T<7> are each 1 when they are turned ON and are 0 when they are turned OFF. The VPGM_MIN is outputted when the gate transistors S<0< to S<3> and the gate transistors T<0> to T<7> are all turned OFF and the VPGM_MAX is outputted when they are all turned ON.

As described above, the second embodiment in the present invention not necessary with a pair of differential amplifiers and uses a current additional D/A converter where a binary code is combined or the binary code is combined with a thermometer code. The second embodiment in the present invention eliminates the problem per se of the offset between the differential amplifiers by removing a pair of the differential amplifiers and can provide the voltage generation circuit that steps up the voltage in a high accurate and constant width of voltage step. In addition, according to the second embodiment in the present invention, the binary code is used for the lower bits of the voltage set data composing a plurality of bits and the thermometer code is used for the upper bits, and the affection of dispersion in the resistance values of individual resistive elements can be minimized when the most significant bit (MSB) is switched by each applying the addition method of the resistance values of corresponding resistive elements to the case where the binary code is controlled and the case where the thermometer code is controlled.

Third Embodiment

However, in the current additional voltage setting circuit where the binary codes is combined shown in the first embodiment, a plurality of the resistive elements are used in the current addition section, for example, the resistance value of resistive element R of the binary code shown in FIG. 1 deviate from the original value (design value) by the deviation of a local resistance value (what the resistance value of a resistive element deviate from the allowable scope) due to dispersion in processes or the like. In this case, the deviation may possibly occur in an additional current value that should be originally constant and even the stepped-up voltage, and an improvement may be made in this regard. The third embodiment is characterized by providing a redundancy circuit where a resistive element showing an abnormal resistance value is replaced with a resistive element of normal resistance value by the redundancy replacement method that replaces a defective cell known in the semiconductor memory.

Figure 8:
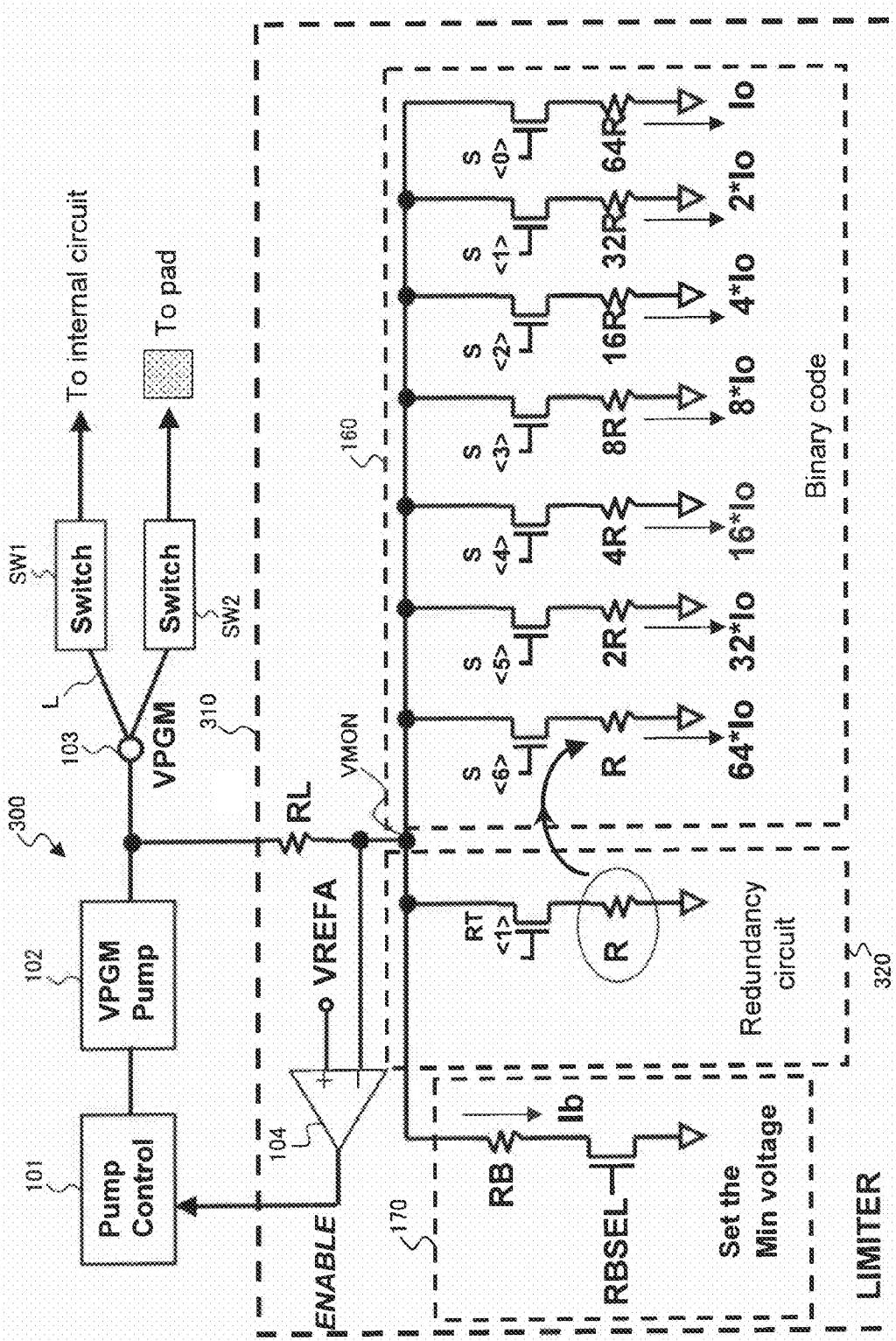
FIG. 8 is a view showing a connection relation between a voltage generation circuit and a tester of a third embodiment in the present invention.

A connection relation between the voltage generation circuit and the tester that tests the motions of the voltage generation circuit of the third embodiment is shown in FIG. 8. The voltage generation circuit 300 whose switches SW1, SW2 are connected in parallel to the output node 103, and the tester (not illustrated) is connected through a pad connected to the switch SW2. In addition, the output node 103 is connected to the internal circuit (not illustrated) inside the chip utilizing the voltage generation circuit 300 through the switch SW1.

Figure 10:
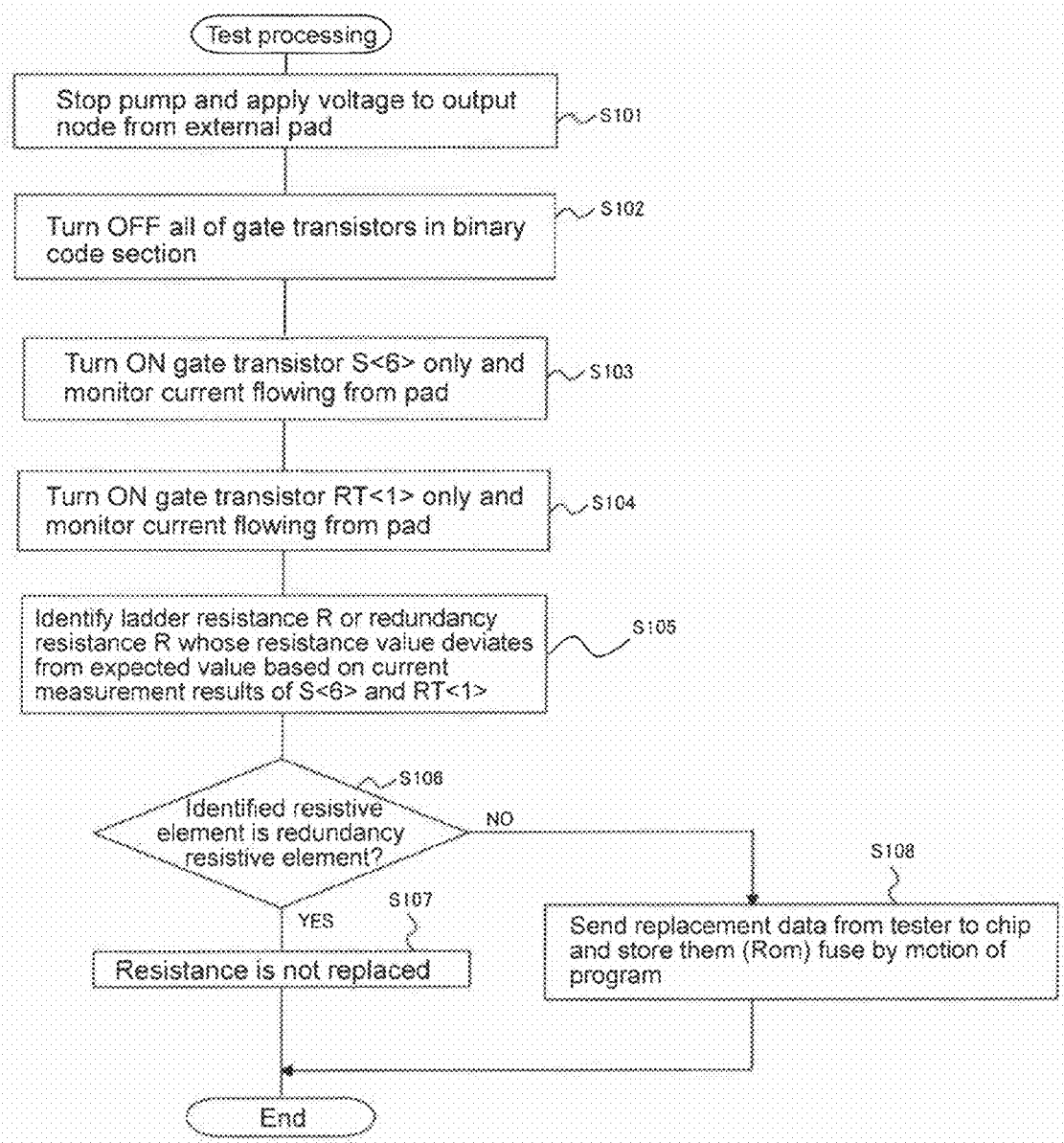
FIG. 10 is a flow chart showing a test processing to be executed in a tester of the third embodiment in the present invention.

The tester is a device (tester) that monitors the outputted current by switching a plurality of the ladder resistances composing the voltage setting circuit (binary current addition section) built-in the voltage generation circuit 300, identifies the ladder resistance whose resistance value deviate from the allowable scope based on the results of the current measurement, and executes the test processing such as replacing the identified ladder resistance with a resistance inside the redundancy circuit later described (see FIG. 10). In addition, the CPU (not illustrated) that executes a test processing program, the RAM (not illustrated) that stores the test processing program should be built-in the tester. In addition, the tester controls the switches SW1, SW2 and has a function that individually controls the motions of the charge pump circuit 102 inside the voltage generation circuit 300 and the gate transistors provided by ladder resistance inside the voltage setting circuit 160.

Figure 9:
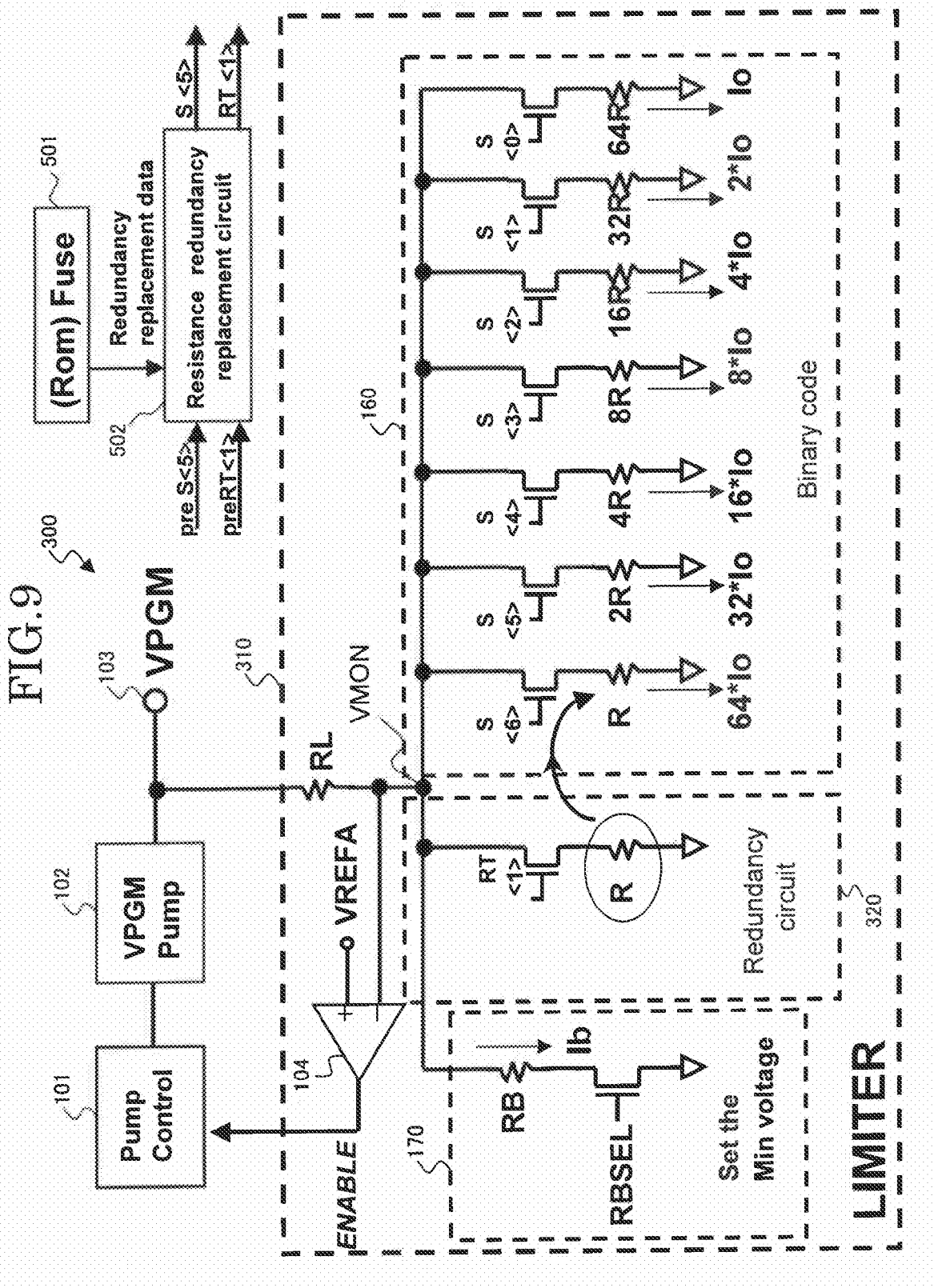
FIG. 9 is a circuit diagram of a voltage generation circuit of the third embodiment in the present invention.

A circuit diagram of the voltage generation circuit 300 is shown in FIG. 9. The voltage generation circuit 300 of the third embodiment in the present invention shown in FIG. 9 is a current additional limiter where the binary code is combined. The inventor of the present invention has created the system as an embodiment that replaces the resistive element with a resistive element inside the redundancy circuit 320, if a desired set voltage can not be correctly obtained because the system is affected by an error of a resistance value of the resistive element at the time of switching the MSB (Most Significant Bit). In addition, the same symbols are denoted in the same composition portions as in the voltage generation circuit shown in FIG. 1 to omit the composition descriptions in the voltage generation circuit 300 shown in FIG. 9.

The voltage generation circuit 300 of the third embodiment shown in FIG. 9 is composed of one differential amplifier 104, the voltage charge pump circuit 102, the pump control circuit 101, and the limiter circuit 310. The limiter circuit 310 is provided with one differential amplifier 104, the minimum voltage setting circuit 170, the redundancy circuit 320, and the voltage setting circuit 160. The voltage generation circuit 300 uses the binary current additional voltage setting circuit 160.

The redundancy circuit 320 is a circuit that is replaced with a redundancy resistance R by an instruction from the tester, if any error of a resistance value in the upper bit R inside the voltage setting circuit 160 that deviate from the allowable scope of the reference resistance value is detected by the tester.

In addition, the (Rom) fuse 501 and the resistance redundancy replacement circuit 502 shown in FIG. 9 are the circuits that are built-in the chip, together with the voltage generation circuit 300.

The (Rom) fuse 501 is a memory that is composed of the ROM or the like storing the replacement data that associates the ladder resistance R of the most significant bits inside the voltage setting circuit 160 and the redundancy resistance R in the redundancy circuit 320, if the upper bit R in the voltage setting circuit 160 are replaced by the redundancy circuit 310 with the test results by the tester. The (Rom) fuse 501 outputs the replacement data that is to be stored to the resistance redundancy replacement circuit 502 when the chip is started.

The resistance redundancy replacement circuit 502 executes a replacement processing that replaces the ladder resistance R of the most significant upper bit in the voltage setting circuit 160 with the redundancy resistance R in the redundancy circuit 320 by turning OFF the gate transistor S<6> in the voltage setting circuit 160 and turning ON the gate transistor RT<1> in the redundancy circuit 320, based on the replacement data outputted from the (Rom) fuse 501.

Next, the test processing that is executed in the tester is described with reference to the flow chart shown in FIG. 10.

In FIG. 10, the tester first stops the operation of the charge pump circuit 102 (VPGM Pump) in the voltage setting circuit 160 and turns ON the switch SW2 to apply the voltage to the output node 103 from the external pad (step S101). Next, the tester turns OFF all of the gate transistors S<0> to S<6> in the voltage setting circuit 160 and the gate transistors RT<1> in the redundancy circuit 320 (step S102).

Next, the tester turns ON the gate transistor S<6> only and monitors the current flowing from the output pad of the ladder resistance R of the upper bits connected to the gate transistor <6> (step S103). In addition, the tester associates the monitored current value with ladder resistance R of the most significant bit to store them in the built-in RAM.

Next, the tester turns ON the gate transistor RT<1> only, monitors the current flowing in the output pad of the redundancy resistance R connected to the gate transistor RT<1>, and associates the monitored current value with the redundancy resistance R to store them in the built-in RAM (step S104).

Next, the tester identifies the resistive elements whose resistance values that deviate from the target value (expected value) out of the ladder resistance R of the most significant bit and the redundancy resistances R, based on the measurement results of the current values of the ladder resistances R of the most significant bit and those of the redundancy resistances R per the step S103 and step S104 (step S105).

Next, the tester judges whether or not the resistive element identified per step S105 is a redundancy resistance R (step S106). It advances to step S107 if the identified resistive element is the redundancy resistance R (step S106: YES). Or, it advances to step S108 if the identified resistive element is not the redundancy resistance R and is the ladder resistance R of the most significant bit (step S106: NO).

In step S107, the tester does not replace a resistance and terminates the test processing because the identified resistive element is the redundancy resistance R.

In addition, in step S108, the tester sends the identified ladder resistance R of the most significant bit and the replacement data on replacing the ladder resistance R with the redundancy resistance R into the chip to start the program inside the chip and stores the replacement data in the (Rom) fuse 501 by the operation of the program to terminate the test processing.

In the case of the third embodiment, the redundancy resistance R is connected into the redundancy circuit 320 so as to replace the ladder resistance R of the most significant bit in the voltage setting circuit 160. Therefore, the replacement data showing that it is replaced with the redundancy resistance R is stored in the (Rom) fuse 501, if the ladder resistance R of the most significant bit is identified as a resistive element whose resistance value deviate from an expected value in the test processing.

After the replacement data is stored in the (Rom) fuse 501 by the test processing with the tester, the replacement data is outputted from the (Rom) fuse 501 to the resistance redundancy replacement circuit 502 in the voltage generation circuit 300, if the chip where the voltage generation circuit 300 is loaded is started. Then, if an voltage setting instruction related to the ladder resistance R of the moist significant bit (MSB) is inputted, the gate transistor RT<1> inside the redundancy circuit 320 is turned ON and the gate transistor S<6> inside the redundancy circuit 160 is turned OFF by the resistance redundancy replacement circuit 502. Then, the VPGM voltage corresponding to the voltage designated by using the redundancy resistance R inside the redundancy circuit 320 is outputted from the output node 103.

As is seen from the foregoing, in the voltage generation circuit 300 of the third embodiment, the redundancy circuit 320 having the redundancy resistance R that replaces the ladder resistance R of the most significant bit in the voltage generation circuit 300 is provided. In the test processing, if the ladder resistance R of the most significant bit of abnormal resistance value deviating from an expected value is identified, the replacement data on replacing the ladder resistance R with the redundancy resistance R is designed to be stored in the (Rom) fuse 501. Therefore, when the chip where the voltage generation circuit 300 is loaded is started, the ladder resistance R of the most significant bit is designed to be replaced with redundancy resistance R by the replacement data stored in the (Rom) fuse 501. Therefore, it is possible to replace the ladder resistance R of the most significant bit (MSB) that is mostly affected by an error of the resistance value of the ladder resistance R with the redundancy resistance R in the voltage generation circuit 300.

Therefore, it is possible to replace an abnormal resistive element with a normal one to ship it at a stage that a chip is tested and it is also possible to realize a high accuracy program voltage step-up that can steadily cope with even dispersion in process. Therefore, the threshold distribution of the memory cell at the time of programming is easily controlled by applying the voltage generation circuit to a flash memory device, the acceleration of a program speed and improvement of a yield of the chip can be expected. Particularly, the voltage generation circuit technology of the third embodiment is considered useful because a high accuracy voltage step-up is required in a flash memory of 8-value or 16-valued cell.

Fourth Embodiment

However, in a current additional voltage setting circuit where the binary code is combined with the thermometer code shown in the second embodiment, a plurality of the resistive elements are used for the current addition section, for example, a resistance value of the resistive element 4R in the thermometer code shown in FIG. 5 deviates from the original value (design value) by a locally deviated resistance value caused by dispersion in process (what a resistance value of a resistive element deviates from the allowable scope) or the like. In this case, the deviation may possibly occur even in the stepped-up voltage which is the additional current value that should be originally constant, an improvement may be made in this regard. The fourth embodiment is characterized by providing the redundancy circuit that replaces a resistance showing an abnormal resistance value with a normal one by utilizing the redundancy replacement method that replaces a defective cell known in the semiconductor memory.

Figure 11:
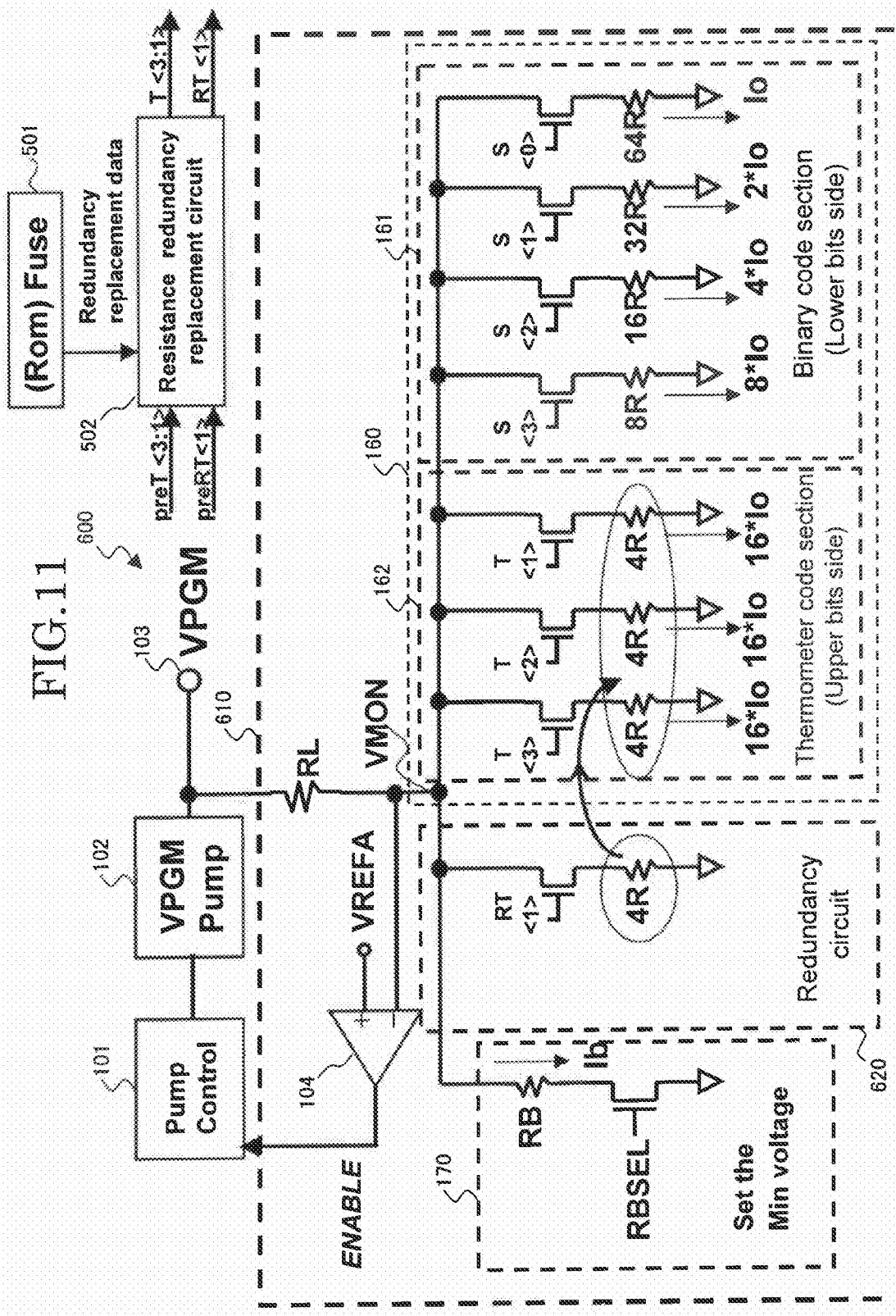
FIG. 11 is a circuit diagram of a voltage generation circuit of a fourth embodiment in the present invention.

A circuit diagram of the voltage generation circuit is shown in FIG. 11. The voltage generation circuit 600 of the fourth embodiment shown in FIG. 11 is a current additional limiter where the thermometer code is combined with the binary code. The inventor of the present invention has created the system as an embodiment that the resistive element is replaced with the resistive element in the redundancy circuit 620, if a desired set voltage can not be correctly obtained by the affection of an error of a resistance value of the resistive element at a time when the MSB (Most Significant Bit) is switched. In addition, in the voltage generation circuit 600 shown in FIG. 11, the same symbols are denoted in the same composition portion as in the voltage generation circuit shown in FIG. 5 to omit the composition descriptions.

The voltage generation circuit 600 of the fourth embodiment shown in FIG. 11 is composed of the charge pump circuit 102, the pump control circuit 101, and the limiter circuit 610. The limiter circuit 610 is provided with one differential amplifier 104, the minimum voltage setting circuit 170, the redundancy circuit 620, the binary code section 161, and the thermometer code section 162. The voltage generation circuit 600 uses a current additional voltage setting circuit by a binary code and a thermometer code.

The redundancy circuit 620 is composed of the gate transistor RT<1> and the redundancy resistance 4R. The redundancy circuit 620 is a circuit that is replaced with the redundancy resistance 4R by an instruction from an external host device (not illustrated), if an abnormality is detected in a resistance value of some ladder resistance 4R out of three ladder resistances 4R in the thermometer code section 162 with the tester.

In addition, the (Rom) fuse 501 and the resistance redundancy replacement circuit 502 shown in FIG. 11 are the circuits that are built-in a chip, together with the voltage generation circuit 600.

The (Rom) fuse 501 is a memory that is composed of a ROM or the like storing the replacement data that associates the ladder resistance 4R and the redundancy resistance 4R in the redundancy circuit 620, if one ladder resistance 4R out of three ladder resistances 4R of the thermometer code section 162 in the voltage setting circuit 160 is replaced by the redundancy circuit 620 with the test results by the tester. The (Rom) fuse 501 outputs the replacement data that is to be stored to the resistance redundancy replacement circuit 502 when the chip is started.

Figure 12:
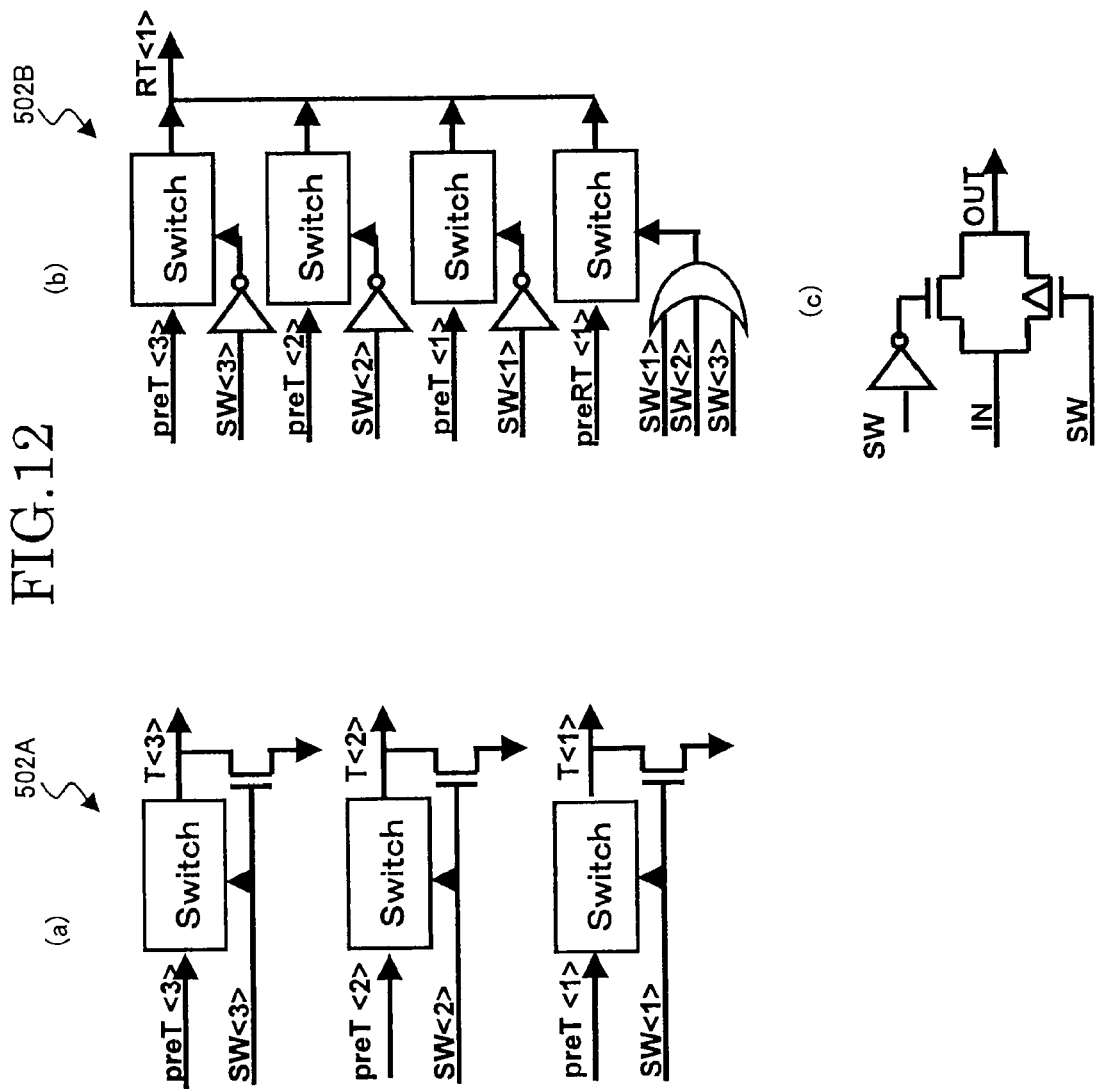
FIG. 12 are views each showing (a) is a circuit diagram of a test switch circuit, (b) is a circuit diagram of a resistance replacement circuit, and (c) is a circuit diagram of a switch in a resistance redundancy replacement circuit of the fourth embodiment in the present invention.

The resistance redundancy replacement circuit 502 has the test switch circuit 502A in the same figure (a) and the resistance replacement circuit 502B in the same figure (b), as shown in FIG. 12. The test switch circuit 502A sequentially switches three ladder resistances 4R in the thermometer code section 162 when the tester executes the tests. The test switch circuit 502B switches the gate transistors when one of the three ladder resistances 4R in the thermometer code 162 is replaced with a redundancy resistance 4R in the redundancy circuit 620, based on the results of the test. In addition, the same figure (c) is a view showing a circuit composition example of the switch used in the test switch circuit 502A and the test switch circuit 502B. In the test switch circuit 502B, "1" is inputted in the preRT<1> if getting access to the redundancy circuit 620 in test or the like. In addition, "0" is inputted in the SW<n> (n=1 to 3) that is to be inputted in the test switch circuit 502A and the test switch circuit 502B, if the replacement data is not stored in the (Rom) fuse 501. "1" is inputted in the SW<n> (n=1 to 3) of the replacement object section that is to be inputted in the test switch circuit 502A and the test switch circuit 502B, if the replacement data is stored.

Next, the composition in case the tester shown in FIG. 8 is connected to the voltage generation circuit 600 in FIG. 11 is described with reference to FIG. 13.

Figure 13:
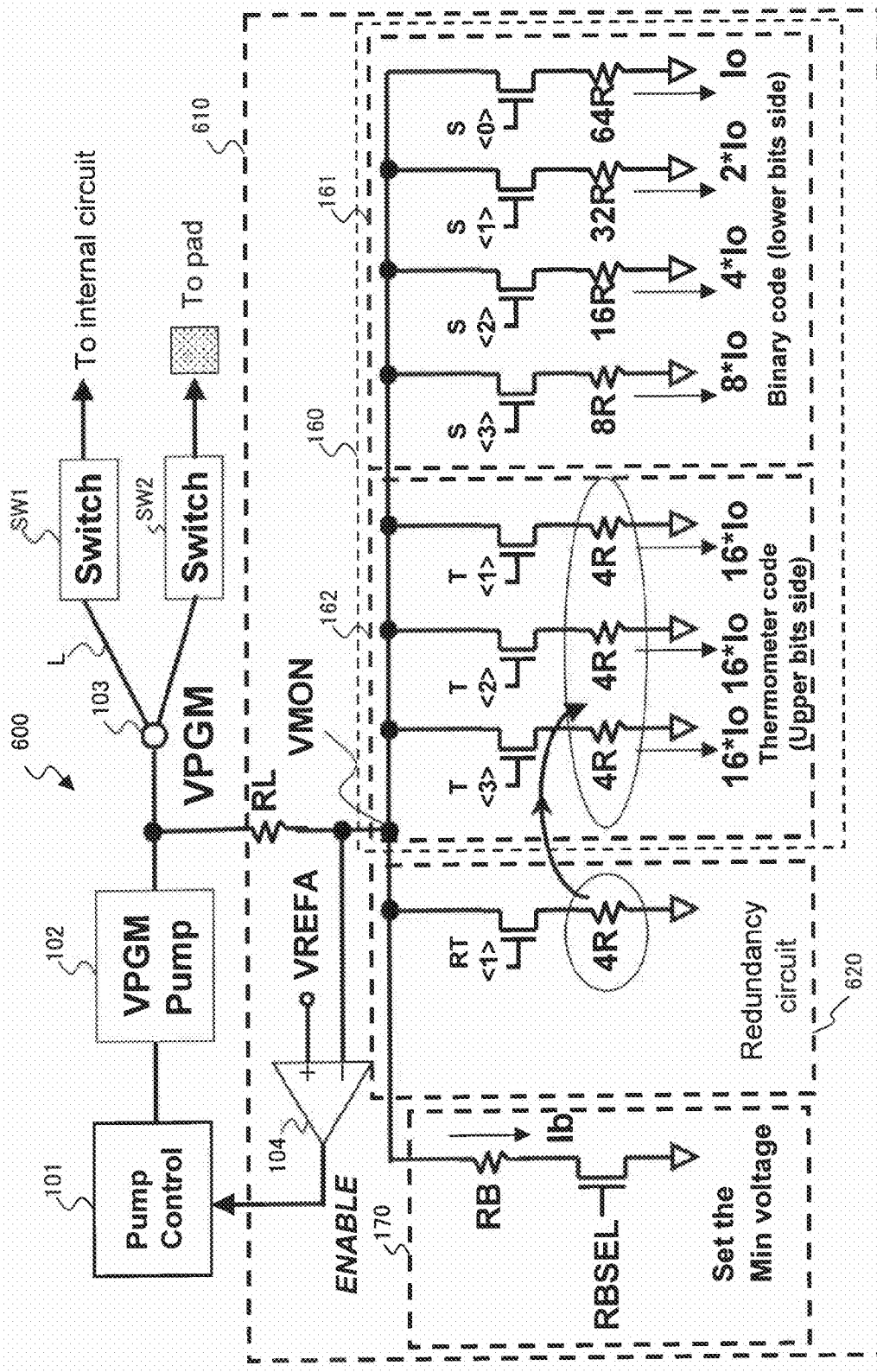
FIG. 13 is a view showing a connection relation between a voltage generation circuit and a tester of the fourth embodiment in the present invention.

As shown in FIG. 13, the switches SW1, SW2 are connected in parallel to the output node 103, an external tester (not illustrated) is connected through a pad connected to the switch SW2, and the internal circuit (not illustrated) inside the chip that uses the voltage generation circuit 600 through the switch SW1 is connected.

Next, the test processing that is executed by the tester is described with reference to the flow chart shown in FIG. 14.

Figure 14:
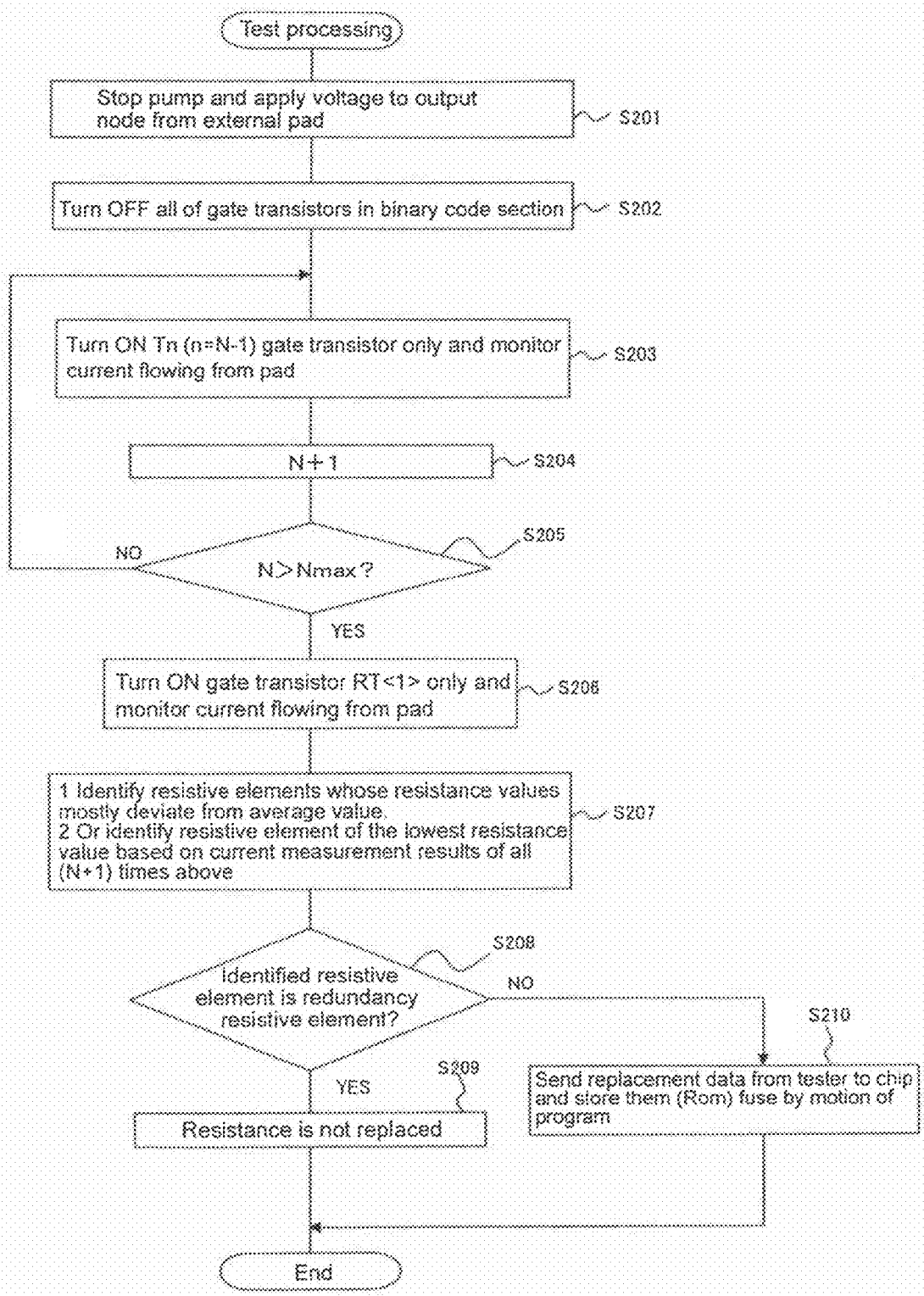
FIG. 14 is a flow chart showing a test processing to be executed in a tester of the fourth embodiment in the present invention.

In FIG. 14, the tester first stops the motions of the charge pump circuit 102 (VPGM Pump) and applies the voltage to the output node 103 from the external pad by turning ON the switch SW2 (step S201). Next, the tester turns OFF all of the gate transistors S<0> to S<3> of the binary code section 161 in the voltage setting circuit 160 (step S202).

Next, the tester turns ON the gate transistor T<1> by the test switch circuit 502A in the resistance redundancy replacement circuit 502 with the parameter Tn (n=N−1) (however, N: 2 to 4, Nmax=4) for selecting the gate transistors T<1> to T<3> of the thermometer code section 162 one by one. Then, the tester monitors the current flowing from the output pad of the ladder resistance 4R connected to the gate transistor T<1> (step S203). In addition, the tester stores the monitored current values in the built-in RAM by ladder resistance.

Next, the tester adds 1 to N to select the next gate transistor (step S204) and judges whether or an addition result becomes larger than the maximum value (Nmax=4) (N>Nmax) (step S205). If the addition result is lower than the maximum value (step S205: NO), it returns to step S203 and repeatedly executes the processing of step S203 to step 204. In addition, if the addition result is bigger than the maximum value (step S205: YES), it advances to step S206. Thus, it terminates the monitoring of the current values of all of the ladder resistance 4R in the thermometer code section 162 by repeatedly executing the processing of step S203 to step S205.

Next, the tester turns ON the gate transistor RT<1>only, monitors the current flowing in the output pad of the redundancy resistance 4R connected to the gate transistor RT<1>, associates the monitored current values with the redundancy resistance 4R to store them in the built-in RAM (step S206).

Next, the tester identifies the resistive element whose resistance value mostly deviates from an average value of each resistance value of each ladder resistance 4R and the redundancy resistance 4R, based on the measurement results of the current values of all the ladder resistance 4R and the redundancy resistance 4R in the thermometer code section 162 per the step S203 to step 206. Or, it identifies the resistive element whose lowest resistance value out of each ladder resistance 4R and the redundancy resistance 4R, based on the measurement results of the current values (step S207).

Next, the tester judges whether or not the identified resistive element per step S207 is a redundancy resistance 4R (step S208). It advances to step S209 if the identified resistive element is the redundancy resistance 4R (step 208: YES). In addition, it advances to step S210 if the identified resistive element is not the redundancy resistance 4R (step S208: NO).

In step S209, the tester does not replace a resistance because the identified resistive element is the redundancy resistance 4R to terminate the test processing.

In addition, in step S210, the tester sends the identified ladder resistance 4R and the replacement data on replacing the ladder resistance 4R with the redundancy resistance 4R into a chip, starts the program inside the chip, and stores the replacement data in the (Rom) Fuse 501 by the motion of the program to terminate the test processing.

After the replacement data is stored in the (Rom) fuse 501 with the foregoing test processing by the tester, the replacement data is outputted from the (Rom) fuse 501 to the resistance redundancy replacement circuit 502 in the voltage generation circuit 600, if the chip where the voltage generation circuit 600 is loaded is started. Then, the gate transistor RT<1> in the redundancy circuit 620 is turned ON and the n-th gate transistor T<n> is turned OFF that is to be replaced in the thermometer code section 162 by the resistance redundancy replacement circuit 502, if a voltage setting instruction related to the ladder resistance 4R of the most significant bit (MSB) in the thermometer code section 162 is inputted. Then, the VPGM voltage corresponding to the voltage designated by using the redundancy resistance 4R in the redundancy circuit 620 is outputted from the output node 103.

As is seen from the foregoing, in the voltage generation circuit 600 of the fourth embodiment, the redundancy circuit 620 having the redundancy resistance 4R that replaces the ladder resistance 4R of the most significant bit in the thermometer code section 162 in the voltage generation circuit 600 is provided. The replacement data on replacing the ladder resistance 4R with the redundancy resistance 4R is designed to be stored in the (Rom) Fuse 501, if the ladder resistance 4R of abnormal resistance value is identified in the test processing. Then, the ladder resistance 4R is designed to be replaced with the redundancy resistance 4R by the replacement data stored in the (Rom) fuse 501, when the chip where the voltage generation circuit 600 is loaded is started. Therefore, it is possible to replace the ladder resistance 4R of the most significant bit (MSB) that is mostly affected by an error of the resistance value in the thermometer code section 162 with the redundancy resistance 4R in the voltage generation circuit 600.

Therefore, it is possible to replace an abnormal resistive element with a normal one to ship it at a stage that a chip is tested and it is also possible to realize a program voltage step-up that can steadily prevent dispersion in processes and is more high accuracy. Therefore, the threshold distribution of the memory cell at the time of programming is easily controlled by applying the voltage generation circuit to a flash memory device, and the acceleration of a program speed and an improvement in a yield of the chip can be expected. Particularly, the voltage generation circuit technology of the fourth embodiment is considered useful because a high accuracy voltage step-up is required in a flash memory of 8-valued or a 16-valued cell.

Fifth Embodiment

In the current additional voltage setting circuit where the binary code is combined with the thermometer code shown in the fourth embodiment, the case where the redundancy circuit that replaces a ladder resistance showing an abnormal resistance value in the thermometer code section with a normal one is provided by using the redundancy replacement method that replaces a defective cell known in the semiconductor memory. The fifth embodiment is characterized by further providing a resistive element that replaces the ladder resistance showing an abnormal resistance value inside the binary code section in the redundancy circuit.

Figure 15:
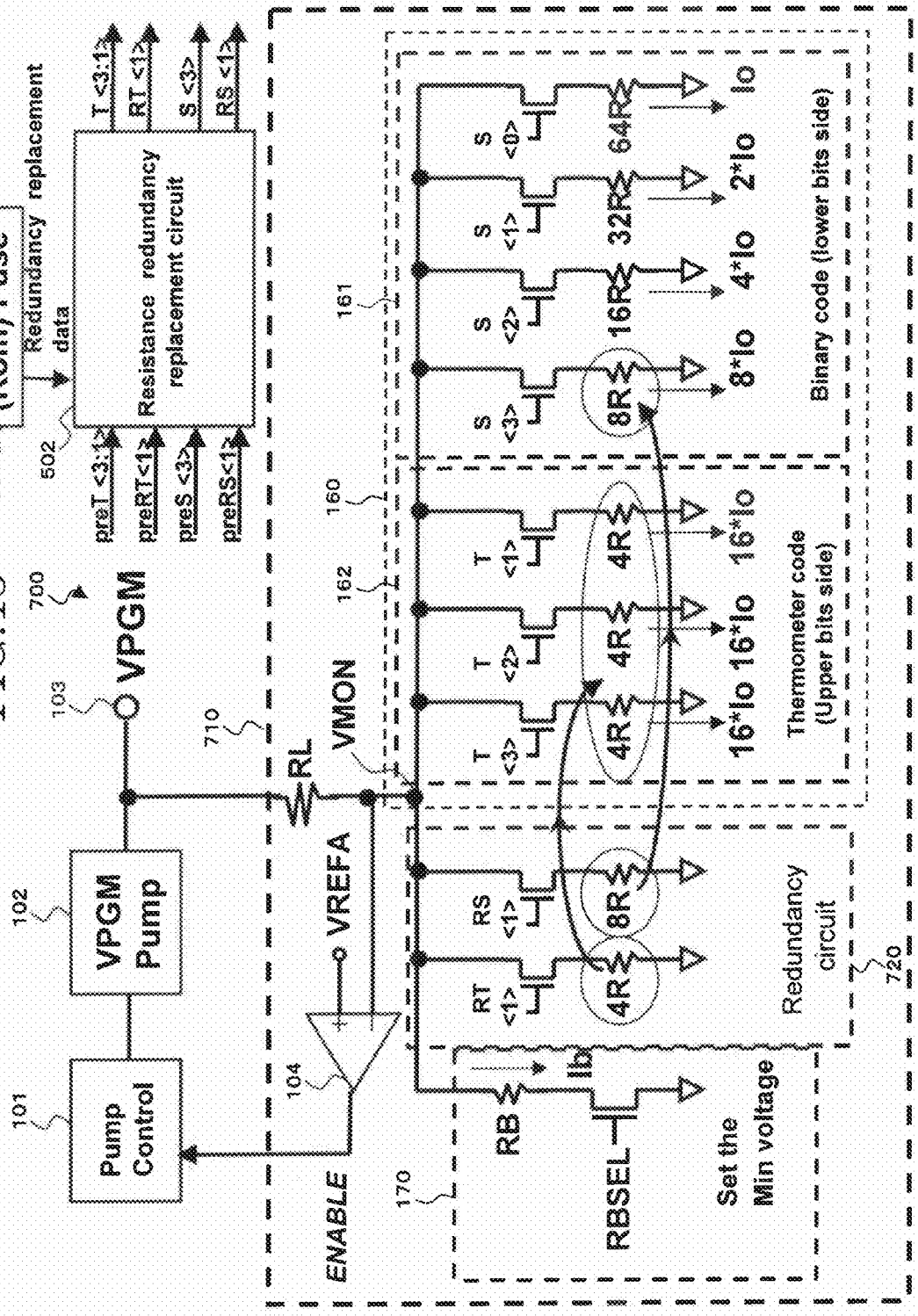
FIG. 15 is a circuit diagram of a voltage generation circuit of a fifth embodiment in the present invention.

A circuit diagram of the voltage generation circuit is shown in FIG. 15. The voltage generation circuit 700 of the fifth embodiment shown in FIG. 15 is a current additional limiter where a thermometer code is combined with a binary code. The inventor of the present invention has created the system as an embodiment that the resistive element is replaced with a resistive element in the redundancy circuit 720, if a desired set voltage can not be correctly obtained by the affection of an error of a resistance value of the resistive element at a time when the MSB (Most Significant Bit) is switched. In addition, in the voltage generation circuit 500 shown in FIG. 15, the same symbols are denoted in the same composition portions as in the voltage generation circuit shown in FIG. 5 to omit the composition descriptions.

The voltage generation circuit 700 of the fifth embodiment shown in FIG. 15 is composed of one differential amplifier 104, the charge pump circuit 102, the pump control circuit 101, and the limiter circuit 710. The limiter circuit 710 is provided with one differential amplifier 104, the minimum voltage setting circuit 170, the redundancy circuit 720, the binary code section 161, and the thermometer code section 162. The voltage generation circuit 700 uses a current additional voltage setting circuit by a binary code and a thermometer code.

The redundancy circuit 720 is composed of the gate transistor RT<1> (the second gate transistor), the RS<1> (the first gate transistor) and the redundancy resistances 4R, 8R. The redundancy circuit 720 is a circuit that is replaced with the redundancy resistance 4R (the second resistive element) by an instruction from an external host device (not illustrated), if an abnormality in a resistance value of some ladder resistance 4R out of three resistances 4R in the thermometer code section 162 is detected by the tester. In addition, the redundancy circuit 720 is a circuit that is replaced with the redundancy resistance 8R (the first resistive element) by an instruction from an external host device (not illustrated), if an abnormality in a resistance value of the ladder resistance 8R out of four ladder resistances in the binary code section 161 is detected by the tester.

In addition, the (Rom) fuse 501 and the resistance redundancy replacement circuit 502 shown in FIG. 15 are the circuits that are built-in the chip, together with the voltage generation circuit 700.

The (Rom) fuse 501 is a memory that is composed of a ROM or the like storing the replacement data (the second replacement data and the first replacement data) that associates the ladder resistances 4R, 8R with the redundancy resistances 4R, 8R in the redundancy circuit 720, if one ladder resistance 4R in the thermometer code section 162 of the voltage setting circuit 160 and one ladder resistance 8R in the binary code section 161 are replaced by the redundancy circuit 720 with the test results with the tester. The (Rom) fuse 501 outputs the replacement data that is to be stored to the resistance redundancy replacement circuit 502 when the chip is started.

In addition, the illustration and description are omitted as the composition of the connection portion of the voltage generation circuit 700 in FIG. 15 and the tester is the same as that shown in FIG. 13.

Next, the test processing that is executed in the tester is described with reference to the flow chart shown in FIG. 16.

Figure 16:
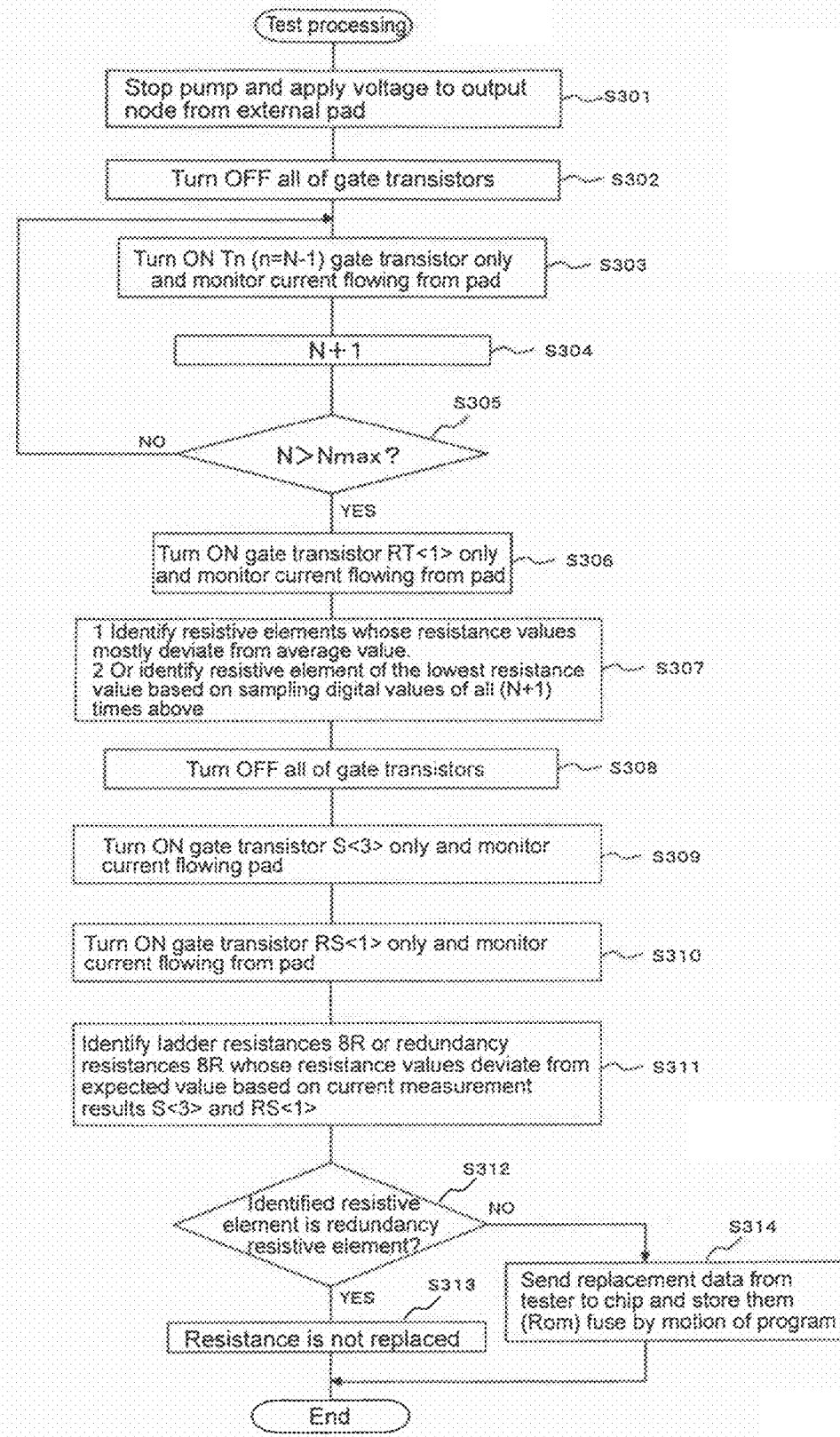
FIG. 16 is a flow chart showing a test processing to be executed in a tester of the fifth embodiment in the present invention.

In FIG. 16, the tester first stops the motions of the charge pump circuit 102 (VPGM Pump) in the voltage generation circuit 700, and turns ON the switch SW2 to apply the voltage to the output node 103 from an external pad (step S301). Next, the tester turns OFF all of the gate transistors in the voltage setting circuit 160 (step S302).

Next, the tester turns ON the gate transistor T<1> by the test switch circuit 502A in the resistance redundancy replacement circuit 502 by using the parameter Tn (n=N-1) (however, N: 2 to 4, Nmax=4) for selecting the gate transistors T<1> to T<3> in the thermometer code section 162 one by one. Then, it monitors the current flowing from the output pad of the ladder resistance 4R connected to the gate transistor T<1> (step S303). In addition, the tester stores the monitored current values in the built-in RAM by ladder resistance.

Next, the tester adds 1 to N to select the next gate transistor (step S304) and judges whether or not the addition result is bigger than the maximum value (Nmax=4) (N>Nmax) (step S305). If the addition result is smaller than the maximum value (step 305: NO), it returns to step S303 and repeats the step S303 and S304. In addition, if the addition result is bigger than the maximum value (step 305: YES), it advances to step S306. Thus, it terminates the monitoring of the current values of all the ladder resistances in the thermometer code section 162 by repeatedly executing the processing of step S303 to step S305.

Next, the tester turns ON the gate transistor RT<1> only, monitors the current flowing in the output pad of the redundancy resistance 4R connected to the gate transistor RT<1>, and associates the monitored current value with the redundancy resistance 4R to store them in the built-in RAM (step S306).

Next, the tester identifies the resistive element whose resistance value mostly deviates from an average value of each resistance value out of each ladder resistance and the redundancy resistance 4R, based on the measurement results of the current values of all of the ladder resistances and the redundancy resistance 4R in the thermometer code section 162 per step S303 to step S306. In addition, it identifies the resistive element of the lowest resistance value out of each ladder resistance and the redundancy resistance 4R, based on the measurement results of the current values (step S307).

Next, the tester turns OFF all of the gate transistors in the voltage setting circuit 160 (step S308).

Next, the tester turns ON the gate transistor S<3> of the binary code section 161 only and monitors the current flowing from the output pad of the ladder resistance 8R connected to the gate transistor S<3> (step S309). In addition, the tester associates the monitored current values with the ladder resistances 8R to store them in the built-in RAM.

Next, the tester turns ON the gate transistor RS<1> only, monitors the current flowing in the output pad of the redundancy resistance 8R connected to the gate transistor RS<1>, and associates the monitored current values with the redundancy resistances 8R to store them in the built-in RAM (step S310).

Next, the tester identifies the resistive elements whose resistance values deviate from the target value (expected value) out of the ladder resistance 8R and the redundancy resistance 8R, based on the measurement results of the current values of the ladder resistance 8R and the redundancy resistance 8R in the binary code section 161 per the step S309 and step S310 (step S311).

Next, the tester judges whether or not the resistive elements identified per the step S307 and step S311 are the redundancy resistances 4R, 8R (step S312). If the identified resistive elements are the redundancy resistances 4R, 8R (step S312: YES), it advances to step 313. In addition, the identified resistive elements are not the redundancy resistances 4R, 8R (step S312: NO), it advances to step S314.

In step S315, the tester does not replace resistances because the identified resistive elements are the redundancy resistances 4R, 8R and terminates the test processing.

In addition, in step S314, the tester sends the identified ladder resistances 4R, 8R and the replacement data that replaces the ladder resistances 4R, 8R with the redundancy resistances 4R, 8R into the chip, starts the program inside the chip, stores the replacement data in the (Rom) fuse 501 by the motion of the program to terminate the test processing.

After the replacement data is stored in the (Rom) fuse 501 by the test processing by the tester, if the chip where the voltage generation circuit 700 is loaded is started, the replacement data is outputted from the (Rom) fuse 501 to the resistance redundancy replacement circuit 502 in the voltage generation circuit 700. Then, if a voltage setting instruction related to the ladder resistance 4R of the most significant bit (MSB) in the thermometer code section 162 or the ladder resistance 8R of the most significant bit (MSB) in the binary code section 161 is inputted from an external host CPU or the like, the gate transistor RT<1> or the gate transistor RS<1> in the redundancy circuit 720 is turned ON, and the gate transistor T<n> in the thermometer 162 or the gate transistor S<3> in the binary code section 161 is turned OFF by the resistance redundancy replacement circuit 502. Then, the VPGM voltage corresponding to the designated voltage is outputted to the output node 103 by using the redundancy resistance 4R or 8R in the redundancy circuit 720.

As is seen from the foregoing, in the voltage generation circuit 700 of the fifth embodiment, the redundancy circuit 720 having the ladder 4R of the most significant bit in the thermometer code section 162 in the voltage generation circuit 700, and the redundancy resistances 4R, 8R that replace the ladder resistance 8R of the most significant bit in the binary code section 161 is provided. If the ladder resistance of abnormal resistance value is identified in the test processing, the replacement data on replacing the ladder resistances 4R, 8R with the redundancy resistances 4R, 8R is designed to be stored in the (Rom) fuse 501. Then, the ladder resistances 4R, 8R are designed to be replaced with the redundancy resistances 4R, 8R by the replacement data stored in the (Rom) fuse 501, when the chip where the voltage generation circuit 700 is loaded is started. Therefore, it is possible to replace the ladder resistances 4R, 8R of the most significant bit (MSB) that is mostly affected by an error of the resistance value in one or both of the thermometer code section 162 and the binary code section 161 with the redundancy resistances 4R, 8R in the voltage generation circuit 700.

Therefore, it is possible to replace an abnormal resistive element with a normal one to ship it at a stage that a chip is tested and it is possible to realize a program voltage step-up that can steadily prevent dispersion in process and is more high accuracy. Therefore, the threshold distribution of a memory cell at the time of programming is easily controlled by applying the voltage generation circuit to a flash memory device, and the acceleration of a program speed and an improvement in a yield of the chip can be expected. Particularly, the voltage generation circuit technology of the fifth embodiment is considered useful, because a high-precision voltage step-up is required in a flash memory 8-valued or 16-valued cell.

Sixth Embodiment

In the current additional voltage setting circuit where a binary code is combined with a thermometer code of the fifth embodiment, there is shown a case that the redundancy circuit where each ladder resistance showing an abnormal resistance value in the thermometer code section and the binary code section are replaced with individual normal resistive elements is provided, by using the redundancy replacement method that replaces a defective cell known in the semiconductor memory. The sixth embodiment is characterized by providing common resistive elements that replace ladder resistances showing abnormal resistance values in the thermometer code section and the binary code section in the redundancy circuit.

Figure 17:
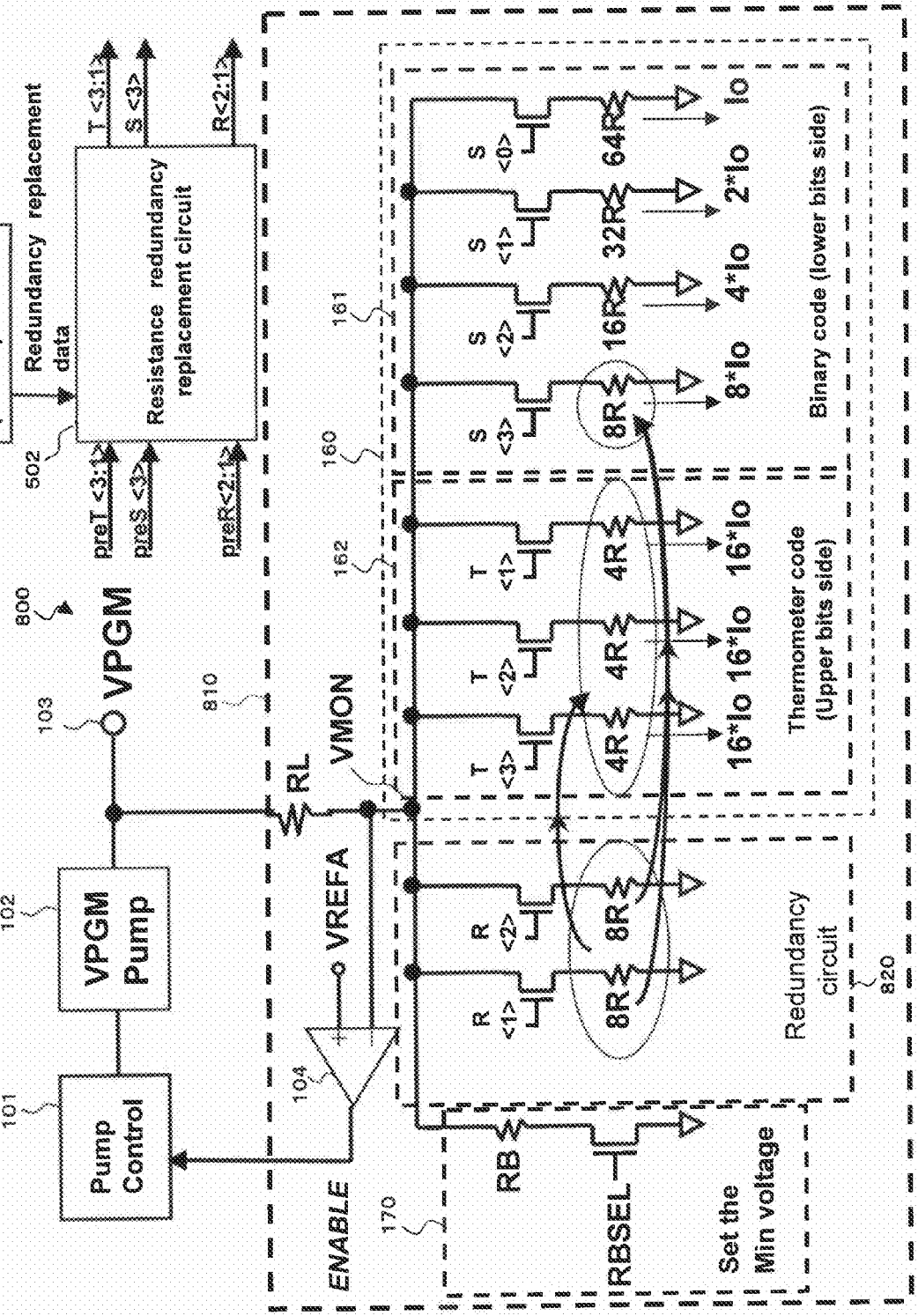
FIG. 17 is a circuit diagram of a voltage generation circuit of a sixth embodiment in the present invention.

A circuit diagram of the voltage generation circuit is shown in FIG. 17. The voltage generation circuit 800 of the sixth embodiment shown in FIG. 17 is a current additional limiter where a thermometer code is combined with a binary code. The inventor of the present invention has created the system as an embodiment that the resistive element is replaced with a resistive element in the redundancy circuit 820, if a desired set voltage can not be correctly obtained by the affection of an error of a resistance value of the resistive element at a time when the MSB (Most Significant Bit) is switched. In addition, in the voltage generation circuit 800 shown in FIG. 17, the same symbols are denoted in the same composition portions as in the voltage generation circuit shown in FIG. 5 to omit the composition descriptions.

The voltage generation circuit 800 of the sixth embodiment shown in FIG. 17 is composed of one differential amplifier 104, the charge pump circuit 102, the pump control circuit 101 and the limiter circuit 810. The limiter circuit 810 is provided with one differential amplifier 104, the minimum voltage setting circuit 170, the redundancy circuit 820, the binary code section 161, and the thermometer code section 162. The voltage generation 800 uses a current additional voltage setting circuit by a binary code and a thermometer code.

The redundancy circuit 820 is composed of the gate transistors R<1>, R<2> and two redundancy resistances 8R. The redundancy circuit 820 is a circuit that replaces a ladder resistance 4R with two redundancy resistances 8R (common resistive element) by an instruction from an external host device (not illustrated), if an abnormality is detected in a resistance value of some ladder resistance 4R out of three ladder resistances 4R in the thermometer code section 162 by the tester. In addition, the redundancy circuit 820 is a circuit that replaces a ladder resistance 8R with one redundancy resistance 8R (common resistive element) by an instruction from an external host device (not illustrated), if an abnormality is detected in a resistance value of some ladder resistance 8R out of four ladder resistances 161 in the binary code section 161 by the tester.

In addition, the (Rom) fuse 501 and the redundancy replacement circuit 502 shown in FIG. 17 are the circuits that are built-in the chip, together with the voltage generation circuit 800.

The (Rom) fuse 501 is a memory that is composed of a ROM or the like storing the replacement data (the second replacement data and the first replacement data) that associates the ladder resistances 4R, 8R with two redundancy resistances 8R in the redundancy circuit 820, if one ladder resistance 4R in the thermometer code section 162 and one ladder resistance 8R in the binary code section 161 are replaced by the redundancy circuit 820 with the test results by the tester. The (Rom) fuse 501 outputs the replacement data that is to be stored to the resistance redundancy replacement circuit 502 at a time when the chip is started.

In addition, the illustration and descriptions of the composition of the connection portion of the voltage generation device 800 in FIG. 17 and the tester are omitted because they are the same ones as shown in FIG. 13.

Next, the test processing that is executed in the tester is described with reference to the flow chart shown in FIG. 18.

Figure 18:
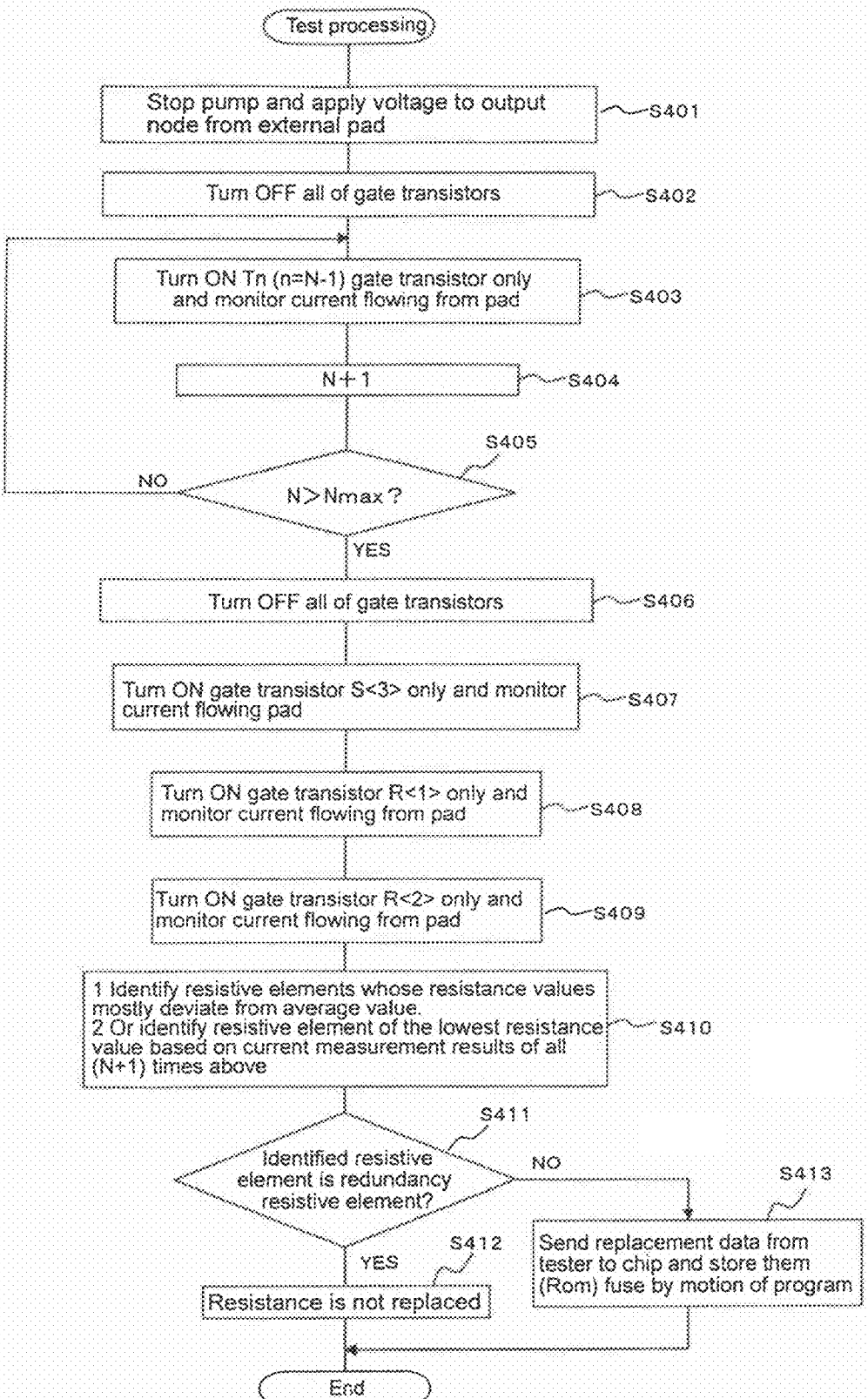
FIG. 18 is a flow chart showing a test processing to be executed in a tester of the sixth embodiment in the present invention.

In FIG. 18, the tester first stops the motions of the charge pump circuit (VPGM Pump) 102 in the voltage generation circuit 800 and applies the voltage to the output node 103 from an external pad by turning ON the switch SW2 (step S401). Next, the tester turns OFF all of the gate transistors in the voltage setting circuit 160 (step S402).

Next, the tester turns ON the gate transistor T<1> by the test switch circuit 502A in the resistance redundancy replacement circuit 502 using the parameter Tn (n=N−1) (however, N: 2 to 4, Nmax=4) for selecting the gate transistors T<1> to T<3> in the thermometer code section 162 one by one. Then, it monitors the current flowing from the output pad of the ladder resistance 4R connected to the gate transistor T<1> (step S403). In addition, the tester stores the monitored current values in the built-in RAM by ladder resistance.

Next, the tester adds 1 to N to select the next gate transistor (step S404) and judges whether or not the addition result is bigger than the maximum value (Nmax=4) (N>Nmax) (step S405). If the addition result is less than the maximum value (step S405: NO), it returns to step S403 and repeats the processing of the step S403 and S404. In addition, it advances to step S406, if the addition result is bigger than the maximum (step S405: YES). Thus, it terminates the monitoring all of the current values of the ladder resistances in the thermometer code section 162 by repeatedly executing the processing of step S403 to S405.

Next, the tester turns OFF all of the gate transistors in the voltage setting circuit 160 (step S406).

Next, the tester turns ON the gate transistor S<3> only in the binary code section 161 and monitors the current flowing from the output pad of the ladder resistance 8R connected to the gate transistor S<3> (step S407). In addition, the tester associates the monitored current values with the redundancy resistance 8R to store them in the built-in RAM.

Next, the tester turns ON the gate transistor R<1> only, monitors the current flowing in the output pad of the redundancy resistance 8R connected to the gate transistor R<1>, and associates the monitored current values with the redundancy resistance 8R to store them in the built-in RAM (step S408).

Next, the tester turns ON the gate transistor R<2> only, monitors the current flowing in the output pad of the redundancy resistance 8R connected to the gate transistor R<2>, and associates the monitored current values with the redundancy resistance 8R to store them in the built-in RAM (step S409).

Next, the tester identifies the resistive element whose resistant value mostly deviates from the average value of each resistance value out of the resistance values of each ladder resistance and the redundancy resistance 8R, based on the measurement results of the current values of all of the ladder resistances in the thermometer code section 162, the ladder resistance 8R in the binary code section 161, and two redundancy resistances 8R per the step S403 to S409. Or, it identifies the resistive element of the lowest resistance value out of each ladder resistance and the redundancy resistance 8R, based on the measurement results of the current values (step S410).

Next, the tester judges whether or not the resistive element identified per step S410 is the redundancy resistance 8R (step S411). It advances to step S412, if the identified resistive element is the redundancy resistance 8R (step S411: YES). In addition, it advances to step S413, if the identified resistive element is the redundancy resistance 8R (step S411: NO).

In step S412, the tester does not replace the resistance because the identified resistive element is the redundancy resistance 8R and terminates the test processing.

In addition, in the step S413, the tester sends the identified ladder resistance (ladder resistance 4R or 8R) and the replacement data on replacing the ladder resistance with the two redundancy resistances 8R or one redundancy resistance 8R into the chip, starts the program, stores the replacement data in the (Rom) fuse 501 by the motion of the program to terminate the test processing.

In addition, in the step S413, a ladder resistance is replaced with two redundancy resistances 8R connected in parallel in the redundancy circuit 820, if the identified ladder resistance is one ladder resistance 4R out of three ladder resistances 4R in the thermometer code section 161. In addition, the ladder resistance is replaced with one redundancy resistance 8R out of two redundancy resistances 8R in the redundancy circuit 820, if the identified ladder resistance is the ladder resistance 8R in the binary code section 161.

After the replacement data is stored in the (Rom) fuse 501 with the test processing by the tester, if the chip where the voltage generation circuit 800 is loaded is started, the replacement data is outputted from the (Rom) fuse 501 to the resistance redundancy replacement circuit 502 in the voltage generation circuit 800. Then, if a voltage setting instruction related to the ladder resistance 4R of the most significant bit in the thermometer code section 162 or the ladder resistance 8R of the most significant bit in the binary code section 161 is inputted from an external host CPU or the like, one or both of the gate transistor R<1> and the gate transistor R<2> in the redundancy circuit 820 are turned ON, the gate transistor Tn corresponding to the ladder resistance showing an abnormality out of the gate transistors T<3> to <1> in the thermometer code section 162 is turned OFF, or the gate transistor S<3> in the binary code section 161 is turned OFF by the resistance redundancy replacement circuit 502. Then, the VPGM voltage corresponding to the voltage designated by using one or both of two redundancy resistances 8R in the redundancy circuit 820 is outputted from the output node 103.

As is seen from the foregoing, in the voltage generation circuit 800 of the sixth embodiment, the redundancy circuit 820 having two redundancy resistances 8R that commonly replace a plurality of ladder resistances 4R containing the most significant bit in the thermometer code section 162 inside the voltage generation circuit 160 and the ladder resistance 8R of the most significant bit in the binary code section 161 is provided. In the test processing, the information data on replacing the ladder resistances 4R, 8R with the redundancy resistances 8R is designed to be stored in the (Rom) fuse 501, if the ladder resistance of an abnormal resistance value is identified. Then, the ladder resistances 4R, 8R are designed to be replaced with two or one redundancy resistance 8R by the replacement data stored in the (Rom) fuse 501 at a time when the chip where the voltage generation circuit 800 is loaded is started. Therefore, in the voltage generation circuit 800, it is possible to replace the ladder resistances 4R, 8R of the most significant bit (MSB) that are mostly affected by an error of the resistance value in one or both of the thermometer code section 162 and the binary code section 161 with two common redundancy resistances 8R.

Therefore, it is possible to replace an abnormal resistive element with a normal one to ship it at a stage that a chip is tested and it is also possible to realize a program voltage step-up that can steadily prevent dispersion in processes and is more high accuracy. Therefore, the acceleration of a program speed and an improvement in a yield of the chip can be expected, because the threshold distribution at the time of programming is easily controlled by applying the voltage generation circuit to a flash memory. Particularly, the voltage generation circuit technology of the sixth embodiment is considered useful because a high-precision voltage step-up is always required in a flash memory 8-valued or a 16-valued cell.

Seventh Embodiment

In the first to the sixth embodiments, the case where the test of the voltage generation circuit is executed from an external tester is shown. However, the seventh embodiment is characterized in that the test circuit is built-in (BIST: Built-In Self-Test) the chip where the voltage generation circuit is loaded.

Figure 19:
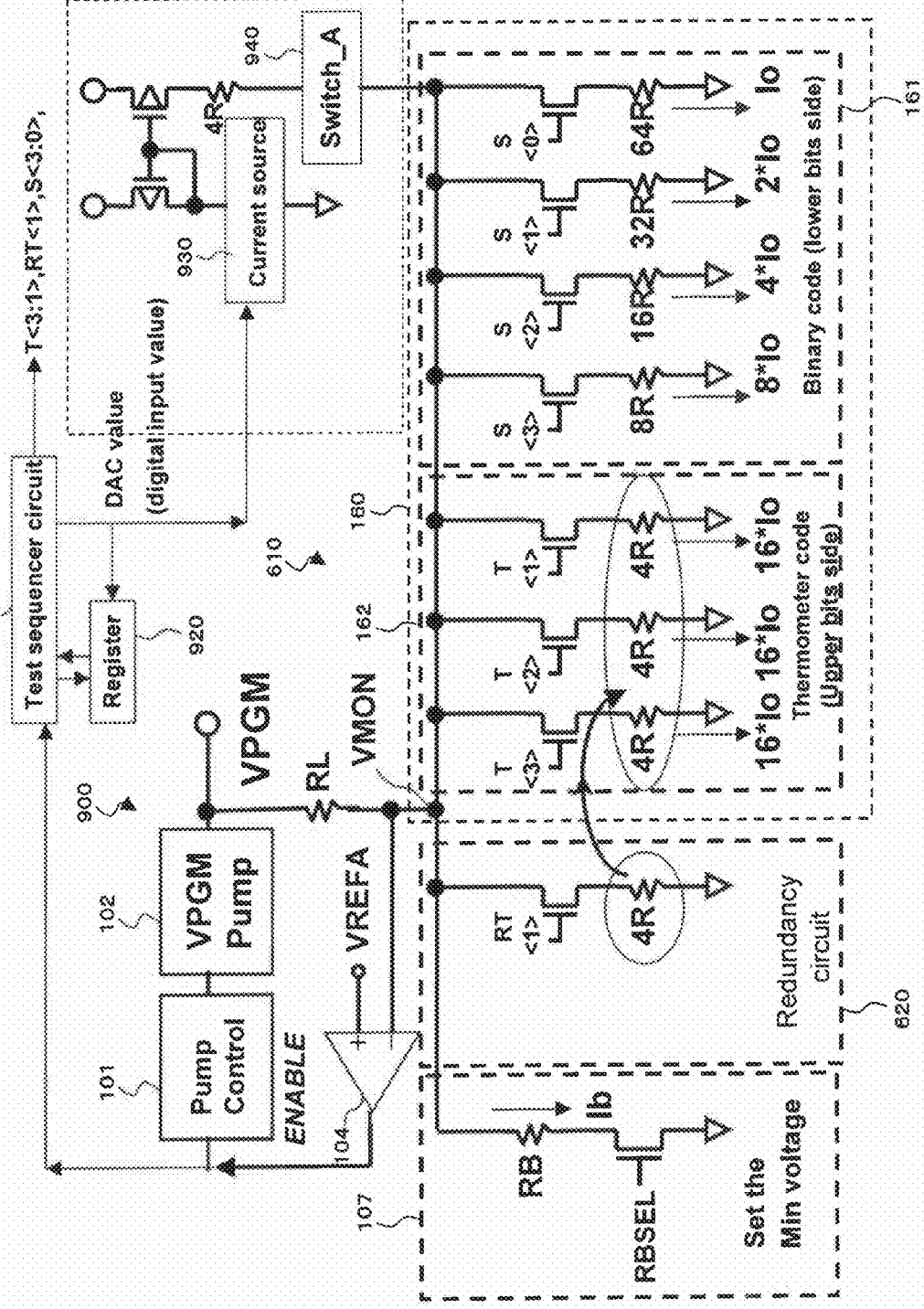
FIG. 19 is a circuit diagram of a voltage generation circuit of a seventh embodiment in the present invention.

A circuit diagram of the voltage generation circuit is shown in FIG. 19. The voltage generation circuit of the seventh embodiment shown in FIG. 19 is a current additional limiter where a thermometer code is combined with a binary code. The inventor of the present invention has created the system as an embodiment that the resistive element is replaced with a resistive element in the redundancy circuit 620, if a desired set voltage can not be correctly obtained by the affection of an error of a resistance value of the resistive element at a time when the MSB (Most Significant Bit) is switched. In addition, in the voltage generation circuit 900 shown in FIG. 19, the same symbols are denoted in the composition portions as in the voltage generation circuit 600 shown in FIG. 11 to omit the composition descriptions.

The voltage generation circuit 900 of the seventh embodiment shown in FIG. 19 is composed of one differential amplifier 104, the charge pump circuit 102, the pump control circuit 101, and the limiter circuit 610. The limiter circuit 610 is provided with one differential amplifier 104, the minimum voltage setting circuit 170, the redundancy circuit 620, the binary code section 161, and the thermometer code section 162. In addition, as the composition for performing the test on the voltage generation circuit 900, the system is provided with the test sequencer circuit 910, the resister 920, the current source 930, and the switch 940. The voltage generation circuit 900 uses a current additional voltage setting circuit by a binary code and a thermometer code.

The test sequencer circuit 910 performs the test on the voltage generation circuit 900. The register 920 stores digital input values at a time when an ENABLE signals are switched. The current source 930 varies the output current in integer multiplication in response to distal input values. The switch 940 (Switch_A) turns ON/OFF the supply of the power supply voltage into the limiter circuit 610. The switch 940 is turned ON at a time when the chip is started from the outside and is turned OFF at a time when it is stopped.

Next, the test processing that is executed in the test sequencer circuit 910 is described with reference to the flow chart shown in FIG. 20.

Figure 20:
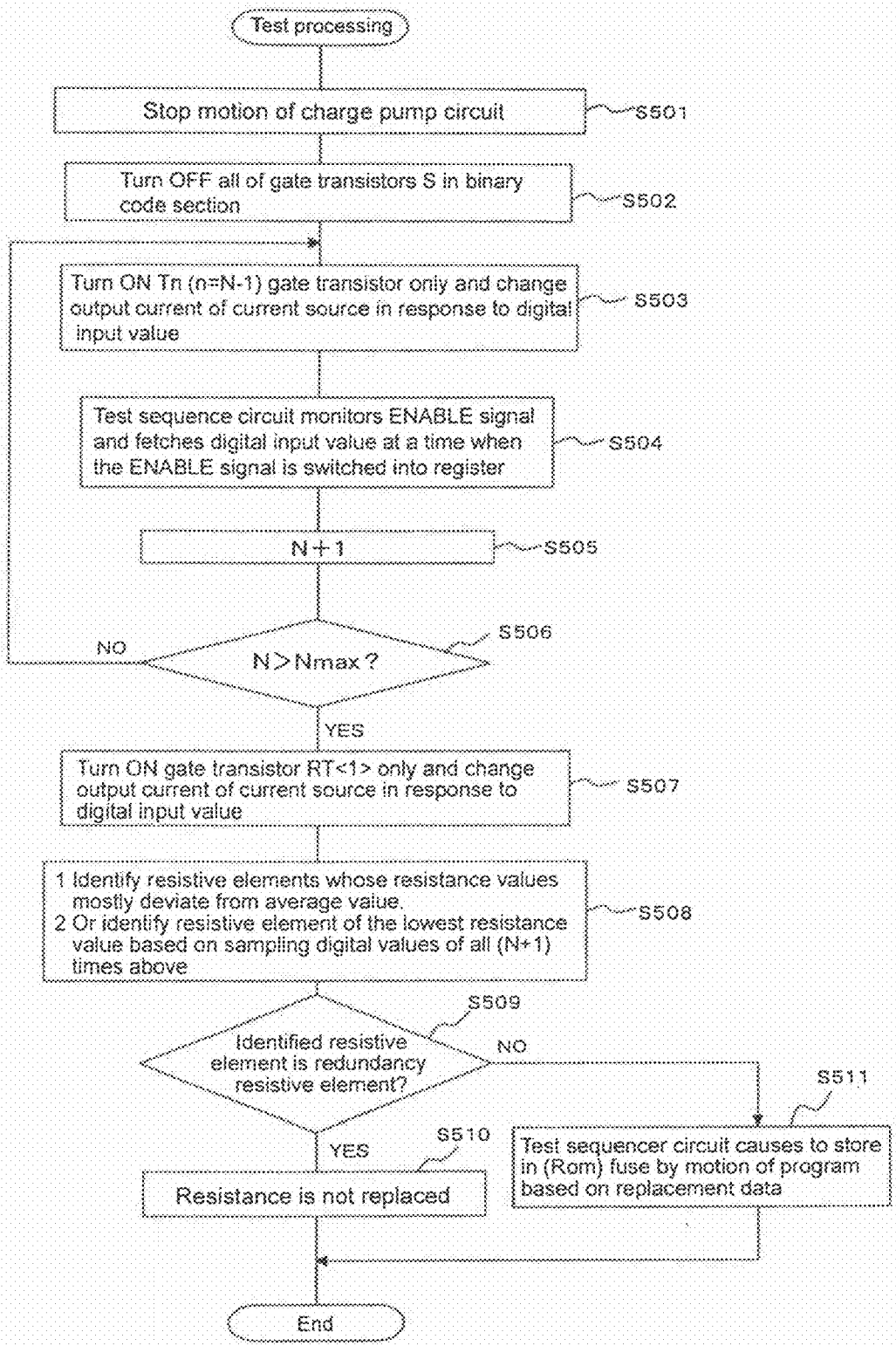
FIG. 20 is a flow chart showing a test processing to be executed in a tester of the seventh embodiment in the present invention.

In FIG. 20, the test sequencer circuit 910 first stops the motions of the charge pump circuit 102 (VPGM Pump) in the voltage generation circuit 900 (step S501). Next, the test sequencer circuit 910 turns OFF all of the gate transistors in the voltage setting circuit 160 (step S502).

Next, the test sequencer circuit 910 turns ON the gate transistor T<1> using the parameter Tn (n=N–1) (however, N: 2 to 4, Nmax=4) for selecting the gate transistors T<1> to T<3> in the thermometer code section 162 one by one to vary the output current of the current source 930 in response to the digital input values (step S503).

Next, the test sequencer circuit 910 monitors an ENABLE signal outputted from the differential amplifier 104 and stores a digital input value at a time when the ENABLE signal is switched in the register 920 (step S504).

Next, the test sequencer circuit 910 adds 1 to N to select the next transistor (step S505) and judges the addition result is bigger than the maximum value (Nmax=4) (N>Nmax) (step S506). It returns to step S503, if the addition result is less than the maximum value (step S505: NO), it returns to step S503 and repeats the processing of the step S503 and S504. In addition, it advances to step S507, if the addition result is bigger than the maximum value (step S506: YES). Thus, it terminates sampling of the digital values of all of the ladder resistances in the thermometer code section 162 by repeatedly executing the processing step S503 to step S506.

Next, the test sequencer circuit 910 turns ON the gate transistor RT<1> only to change the output current of the current source 930 in response to the digital input values (step S507).

Next, the test sequencer circuit 910 identifies the resistive element whose resistance value mostly deviates from the average value of each resistance value out of each ladder resistance and the redundancy resistance 4R, based on each digital value sampled in all of the ladder resistances and the redundancy resistance 4R in the thermometer code section 162 per the step S503 to step S507. In addition, it identifies the resistive element of the lowest resistance value out of each ladder resistance and the redundancy resistance 4R, based on each digital value (step S508).

Next, the test sequencer circuit 910 judges whether or not the resistive element identified per step S508 is the redundancy resistance 4R (step S509). It advances to step 510, if the identified resistive element is the redundancy resistance 4R (step 509: YES). In addition, it advances to step S511, if the identified resistive element is not the redundancy resistance 4R (step S509: NO).

In step S501, the test sequencer circuit 910 does not replace the resistance because the identified resistive element is the redundancy resistance 4R and terminates the test processing.

In addition, in step S511, the test sequencer circuit 910 stores the identified ladder resistance and the information data on replacing the ladder resistance with the redundancy resistance 4R in the (Rom) fuse 501 (not illustrated) with the program motion by starting the program to terminate the test processing.

After the replacement data is stored in the (Rom) fuse 501 with the test processing by the foregoing test sequencer circuit 910, the replacement data is read out from the (Rom) fuse 501 in the voltage generation circuit 900, if the chip where the voltage generation 600 is loaded is started. Then, the gate transistor RT<1> in the redundancy circuit 620 is turned ON and the gate transistor T<n> in the redundancy circuit 162 is turned OFF by the replacement data, if a voltage setting instruction related to the ladder resistance 4R of the most significant bit (MSB) in the thermometer code section 162 is inputted. Then, the VPGM voltage corresponding to the voltage designated by using the redundancy resistance 4R in the redundancy circuit 620 is outputted from the output node 103.

As is seen from the foregoing, in the voltage generation circuit 900 of the seventh embodiment, the redundancy circuit 620 having the redundancy resistance 4R that replaces the ladder resistance 4R of the most significant bit in the thermometer code section 162 in the voltage generation circuit 900 is provided. In addition, the test sequencer 910 that executes the test processing is provided in the voltage generation circuit 900. Then, in the test processing, the information data on replacing the ladder resistance 4R with the redundancy resistance 4R is designed to be stored in the (Rom) fuse, if the ladder resistance of an abnormal resistance value is identified. Then, the ladder resistance 4R is designed to be replaced with the redundancy resistance 4R by the replacement data stored in the (Rom) fuse at a time when the chip where the voltage generation circuit 900 is loaded is started. Therefore, it is possible to replace the ladder resistance 4R of the most significant bit (MSB) that is mostly affected by an error of the resistance value in the thermometer code section 162 in the voltage generation circuit 900 with the redundancy resistance 4R.

Therefore, it is possible to replace an abnormal resistive element with a normal one to ship it at a stage that a chip is tested and it is also possible to realize a program voltage step-up that can steadily prevent dispersion in process and is more high accuracy. In addition, it is possible to replace a defective ladder resistance by executing the test even after the voltage generation circuit is shipped because the test sequencer circuit is designed to be built-in the circuit. Therefore, the acceleration of a program speed and an improvement in a yield of the chip can be expected, because the threshold distribution of a memory cell at the time of programming is easily controlled by applying the voltage generation circuit to a flash memory. Particularly, the voltage generation circuit technology of the present invention is considered useful, because a very high-precision voltage step-up is required in a flash memory 8-valued or 16-valued cell.

Next, the composition that improves the reliability of the redundancy resistance shown in the third to the seventh embodiments is described with reference to FIG. 21.

Figure 21:
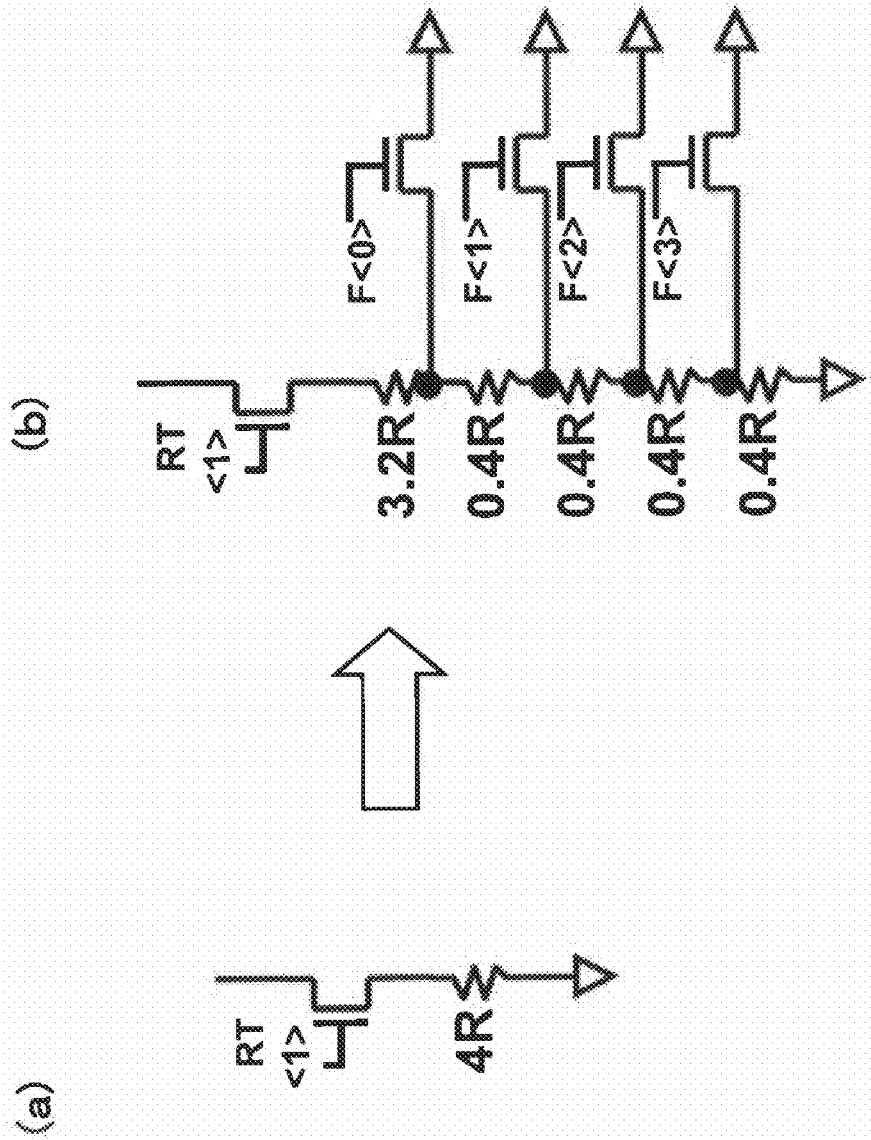
FIG. 21 are views each showing (a) is the original circuit diagram of a redundancy resistance and (b) is the other circuit diagram of the redundancy resistance of other embodiments in the present invention.

FIG. 21(*a*) shows the composition of the redundancy resistance 4R shown in the FIG. 11 and FIG. 19. The redundancy resistance 4R is replaced with a circuit shown in the same figure (b). In this case, one redundancy resistance 4R is replaced with one redundancy resistance 3.2R and three redundancy resistances 0.4R.

The composition is designed to be such that it is replaced with the other redundancy resistance 0.4R, if the resistance value of three redundancy resistances 0.4R or a redundancy resistance 0.4R deviate. For example, it is assumed that the gate transistor F<2> is normally turned ON to replace two redundancy resistances 0.4R. Then, it is possible to replace the redundancy resistance by turning ON the gate transistor F<0> or F<1>, if the resistance value of one redundancy resistance largely deviates. In addition, it is possible to replace the redundancy resistance by turning ON the gate transistor F<3>, if the resistance value of the redundancy resistance 0.4R deviates at a lower level.

As is seen from the foregoing, the circuit redundancy that replaces one ladder resistance is composed of a plurality of resistive resistances and the gate transistors are provided between each resistive element, and this allows the redundancy resistance whose resistance value deviates to be replaced with a combination of other normal redundancy resistances. As a result, defects such as generation of dispersion in resistance value of the redundancy resistance can be adjusted by a plurality of redundancy resistance elements by limiting the redundancy resistances in layout provided inside the chip or the like, thereby enabling the system to improve the reliability of the redundancy resistance.

In addition, in the third to the seventh embodiments, the case that the tester identifies the resistive element whose resistance value mostly deviates from the average of each resistance value and the case that it identifies the resistive element whose resistance value is the lowest one out of those of each ladder resistance and the redundancy resistance are shown as a method for identifying the resistive elements whose resistance values deviate. Any one of the methods for identifying defective elements may be adopted by a control method or the like.

In addition, the semiconductor memory may be provided with the voltage generation circuit according to any one of the first to the seventh embodiments.

In addition, the tester of the third to the sixth embodiments may be provided with a resistance value detection section that detects the resistance values of each resistive element by sequentially switching a plurality of resistive elements provided by the voltage setting circuit, the binary code section (the first voltage setting circuit) and the thermometer code section (the second voltage setting circuit), a resistance value judging section that judges whether or not each resistance value stays within a predetermined scope by comparing each detected resistance value with the reference resistance values of each resistive element, and a (Rom) fuse (replacement data creation section) that creates the replacement data on replacing the resistive element whose detected resistance value judged out of the predetermined scope with the resistive element provided by the redundancy circuit, a first resistive element or a second resistive element to store it in the replacement data memory. The semiconductor memory may be provided with the function of the tester.

In addition, the testers of the third to the sixth embodiments may be also provided with a method for testing a voltage generation circuit that executes a process that detects the resistance values of each resistive element by sequentially switching a plurality of resistive elements provided by the voltage setting circuit, the binary code section (the first voltage setting circuit) and the thermometer code section (the second voltage setting circuit), a process that judges whether or not each resistance value stays within a predetermined scope by comparing each detected resistance value with the reference resistance values of each resistive element, and a process that creates the replacement data on replacing the resistive elements whose each detected resistance value judged out of the predetermined scope with the resistive element, the first resistive element or the second resistive element provided by the redundancy circuit to store it in the replacement data memory.

The invention claimed is:

1. A voltage generation circuit comprising:
a standard voltage generation circuit that generates a reference voltage;
a minimum voltage setting circuit that sets a minimum voltage;
a voltage setting circuit that gradually sets voltage by switching a plurality of gate transistors to switch a combination of a plurality of resistive elements;
a differential amplifier that has two input terminals and one output node, one input terminal is connected to the reference voltage that is generated by the standard voltage generation circuit, another input terminal is connected to the minimum voltage setting circuit and the voltage setting circuit that has the plurality of resistive elements and the plurality of gate transistors connected to the plurality of the resistive elements, and the output node shows the result of the difference voltage of these two inputs;
a pump control circuit that outputs a control signal controlling a charge-pump motion, based on the differential voltage;
a charge pump circuit that sets up and outputs the voltage by the control signal;
a redundancy circuit having a gate transistor and a resistive element that replace a part of resistive elements out of the plurality of the resistive elements inside the voltage setting circuit;
a replacement data memory which stores replacement data of a resistive element of a resistance value which deviates from an expected value among each resistance value of the plurality of the resistive elements which are measured by switching the plurality of the gate transistors of the voltage setting circuit by a test operation by an external tester; and
a replacement section that replaces a part of the resistive element with the resistive element provided by the redundancy circuit by controlling a gate transistor of the part of the resistive element and the gate transistor of the resistive element provided by the redundancy circuit, based on the replacement data stored in the replacement data memory.

2. The voltage generation circuit according to claim 1, wherein the tester switches the plurality of the gate transistors of the voltage setting circuit and the gate transistors of the redundancy circuit in sequence in the test operation and measures each current value which flows to each resistive element, and specifies the resistive element of the resistance value which deviates from the expected value based on the measurement result of each current value, and
the replacement data memory stores replacement data of the resistive element in the case where one out of the plurality of the resistive elements of the voltage setting circuit is specified by the test operation.

3. The voltage generation circuit according to claim 1, wherein the voltage setting circuit has the plurality of the resistive elements of a resistance value of $(1/2)^n$ of a resistance value which is to be a reference and the plurality of the gate transistors connected to the plurality of the resistive elements, and gradually sets the voltage by switching and controlling the plurality of the gate transistors in response to a digital data of a binary code to switch a combination of the plurality of the resistive elements; and
the redundancy circuit is provided with the resistive element that replaces a resistive element corresponding to the most significant bit of the binary code out of the plurality of the resistive elements provided by the voltage setting circuit.

4. The voltage generation circuit according to claim 1, wherein the voltage setting circuit is provided with a first voltage setting circuit that has a plurality of resistive elements of a resistance value of $(1/2)^n$ of a resistance value which is to be a reference and a plurality of gate transistors connected to the plurality of the resistive elements, and gradually sets the voltage by switching and controlling the plurality of the gate transistors in response to a digital data of a binary code to switch a combination of the plurality of the resistive elements, and a second voltage setting circuit has a plurality of resistive elements of the same resistance value as the resistance value which is to be a reference and a plurality of gate transistors connected to the plurality of the resistive elements, and gradually sets the voltage by switching and controlling the plurality of the gate transistors in response to a digital data of a thermometer code comprising a plurality of bits to switch a combination of the plurality of the resistive elements;
the redundancy circuit is provided with the resistive element that replaces a resistive element corresponding to the most significant bit of the thermometer code out of the plurality of the resistive elements provided by the second voltage setting circuit; and
the replacement data memory which stores replacement data of the resistive element of the resistance value which deviates the most from an average value among each resistance value of the plurality of resistive elements which are measured by switching the plurality of gate transistors of the second voltage setting circuit by the test operation by the external tester.

5. The voltage generation circuit according to claim 4, wherein the tester switches the plurality of gate transistors of the second voltage setting circuit and the gate transistors of the redundancy circuit in sequence in the test operation and measures each current value which flows to each resistive element, and specifies the resistive element of the resistance value which deviates the most from the average value based on the measurement result of each current value, and
the replacement data memory stores replacement data of the resistive element in the case where one out of the plurality of the resistive elements of the plurality of first and second voltage setting circuits is specified by the test operation.

6. The voltage generation circuit according to claim 5, wherein the tester specifies the resistive element having the lowest resistance value based on the measurement result of each current value in the test operation.

7. The voltage generation circuit according to claim 4, wherein the redundancy circuit has a first gate transistor and a first resistive element that replace a part of the resistive elements out of the plurality of the resistive elements provided by the first voltage setting circuit and a second gate transistor and a second resistive element that replace a part of the resistive elements out of the plurality of the resistive elements provided by the second voltage setting circuit;
the tester switches the plurality of gate transistors of the second voltage setting circuit and the first and the second gate transistors of the redundancy circuit in sequence, measures each current value which flows to each resistive element and specifies the resistive element of the resistance value which deviates the most from the average value based on the measurement result of each current value, and
the replacement data memory stores replacement data of the resistive element in the case where one out of the plurality of the resistive elements of the second voltage setting circuit is specified by the test operation.

8. The voltage generation circuit according to claim 7, wherein the tester specifies the resistive element having the lowest resistance value based on the measurement result of each current value in the test operation.

9. The voltage generation circuit according to claim 7, wherein the redundancy circuit is provided with the first resistive element that replaces a resistive element corresponding to the most significant bit of the binary code out of the plurality of the resistive elements provided by the first voltage setting circuit and the second resistive element that replaces a resistive element corresponding to the most significant bit of the thermometer code out of the plurality of the resistive elements provided by the second voltage setting circuit.

10. The voltage generation circuit according to claim 7, wherein the redundancy circuit has a plurality of the resistive elements common to a gate transistor that replace both a part of resistive elements out of the plurality of the resistive elements provided by the first voltage setting circuit and a part of resistive elements out of the plurality of the resistive elements provided by the second voltage setting circuit;

the tester switches the gate transistor which corresponds to the most significant bit of the binary code of the first voltage setting circuit, the plurality of gate transistors of the second voltage setting circuit, and the first and second gate transistor of the redundancy circuit in sequence in the test operation, measures each current value which flows to each resistive element, and specifies the resistive element of the resistance value which deviates the most from the average value based on the measurement result of each current value; and the replacement data memory stores a first replacement data in replacing a part of resistive elements in the first voltage setting circuit with common resistive elements provided by the redundancy circuit and a second replacement data in replacing a part of resistive elements in the second voltage setting circuit with common resistive elements provided by the redundancy circuit.

11. The voltage generation circuit according to claim 10, wherein the tester specifies the resistive element having the lowest resistance value based on the measurement result of each current value in the test operation.

* * * * *